United States Patent [19]

Scantlin

[11] 3,987,725

[45] Oct. 26, 1976

[54] PROCESS OF SCREEN MANUFACTURE AND USE FOR CODING CREDIT CARDS

[75] Inventor: John R. Scantlin, Los Angeles, Calif.

[73] Assignee: Transaction Technology, Inc., Los Angeles, Calif.

[22] Filed: Mar. 18, 1974

[21] Appl. No.: 451,997

Related U.S. Application Data

[63] Continuation-in-part of Ser. Nos. 223,272, Feb. 3, 1972, Pat. No. 3,802,101, and Ser. No. 273,434, July 20, 1972.

[52] U.S. Cl............................. 101/128.4; 101/123; 101/127.1; 101/128.3; 101/129; 101/DIG. 18
[51] Int. Cl.²....................... B41C 1/14; B41N 1/27
[58] Field of Search............ 101/128.2, 128.3, 128.4, 101/368, 127.1, 369, 129, DIG. 18, 123; 355/86, 132, 87; 96/27

[56] References Cited
UNITED STATES PATENTS

| | | | |
|---|---|---|---|
| 2,630,755 | 3/1953 | Herrin............................. | 101/128.4 |
| 2,969,732 | 1/1961 | Kendall........................... | 101/128.3 |
| 3,000,104 | 9/1961 | Polayes............................ | 355/86 X |
| 3,356,023 | 12/1967 | Schuttenberg.................. | 101/128.3 |
| 3,453,598 | 7/1969 | Schweizer....................... | 101/369 X |
| 3,507,654 | 4/1970 | Wrench........................... | 101/128.3 X |
| 3,716,296 | 2/1973 | Springer et al. ................. | 355/86 X |

*Primary Examiner*—Edgar S. Burr
*Assistant Examiner*—R. E. Suter
*Attorney, Agent, or Firm*—Charles H. Schwartz

[57] ABSTRACT

A process for forming credit cards in which encoded information is screen printed on a plastic sheet. In the process, a photographic film is placed in contact with a surface having film exposure means positioned with respect to the surface. Locating means are formed on the film and the film is positioned on the surface through the locating means. Thereafter, small predetermined coded spaces are exposed on the film and the exposed film is developed to provide coded darkened spaces corresponding to the exposed coded spaces.

The developed film is placed against a silk screen having first positioning means which coact with the locating means on the film to position the film with respect to the silk screen. The screen is coated with a light-sensitive emulsion and light is shone on the screen through the film to expose the emulsion except at the coded darkened areas.

The screen is washed to provide a coded screen having openings corresponding to the exposed coded spaces on the film. The coded screen is placed in a silk screen press with second positioning means corresponding in placement to the first positioning means. The screen is placed in the press by alignment of the second positioning means with the first positioning means. Ink is passed through the openings in the screen onto a credit card sheet to form screen printed coded spaces on the sheet.

The encoded spaces on the sheet may be printed by using multiple printings.

21 Claims, 41 Drawing Figures

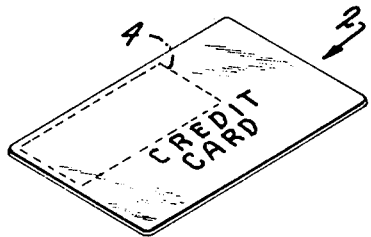
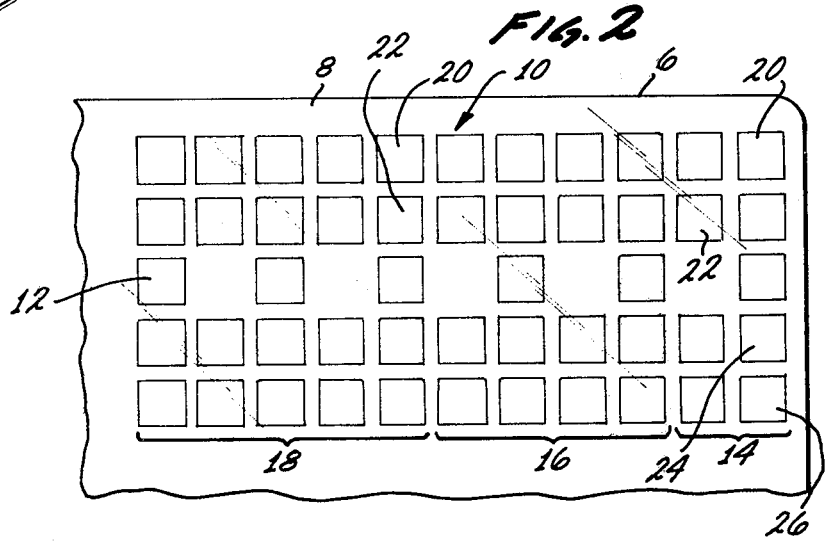
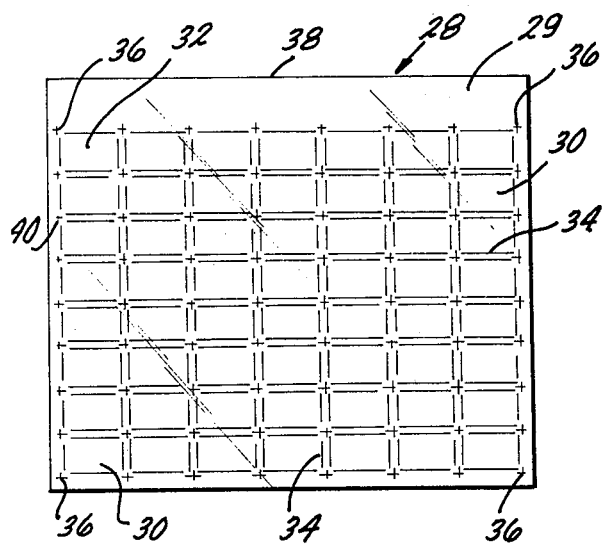
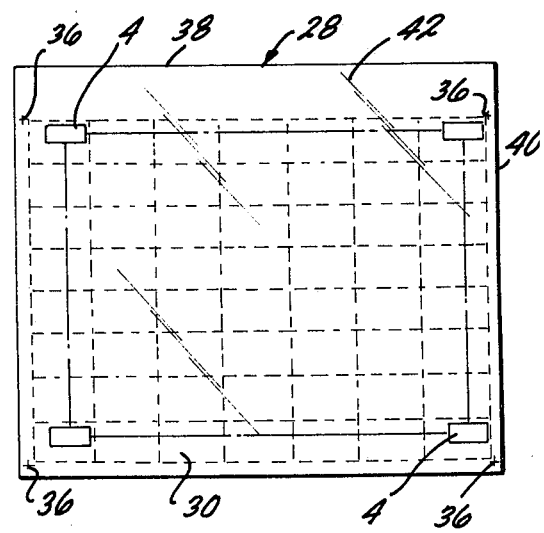

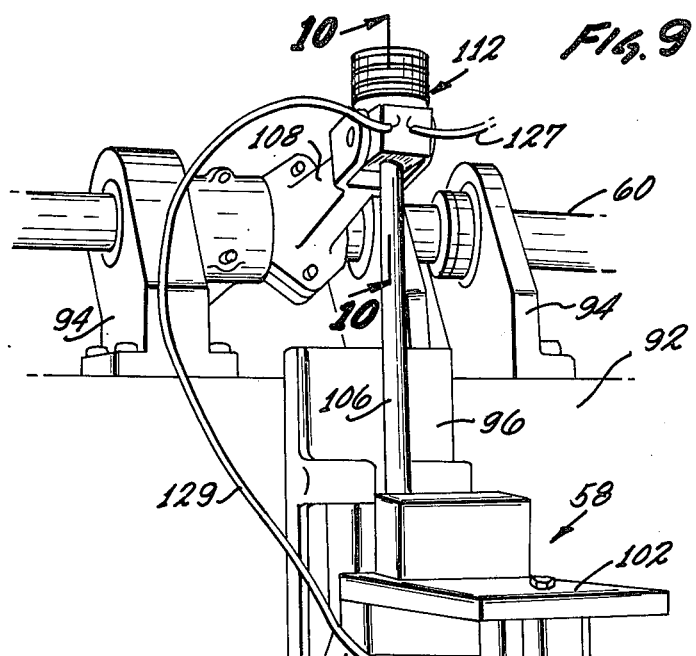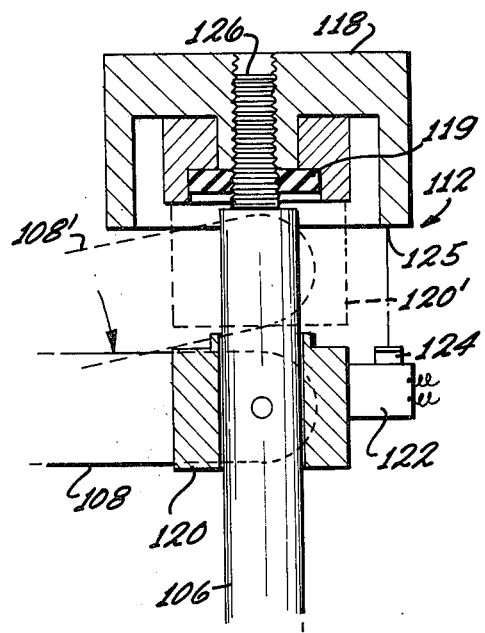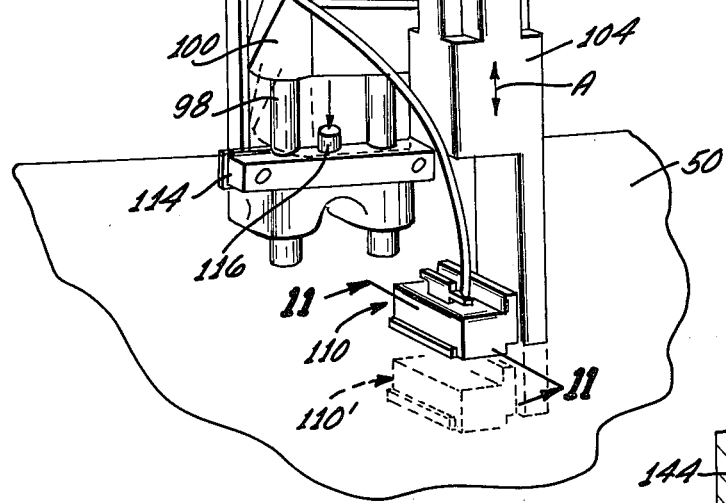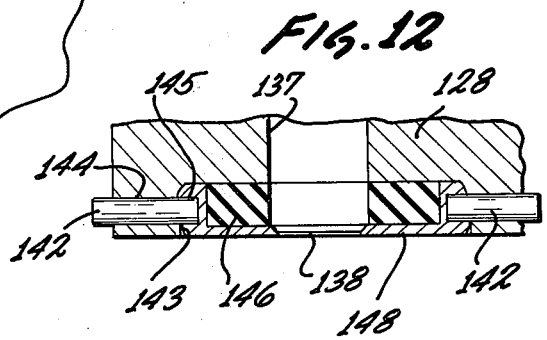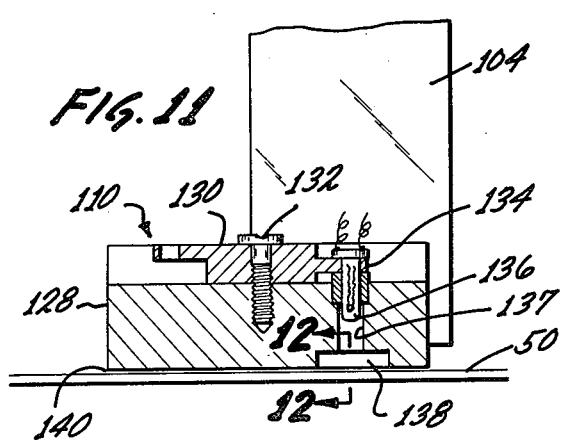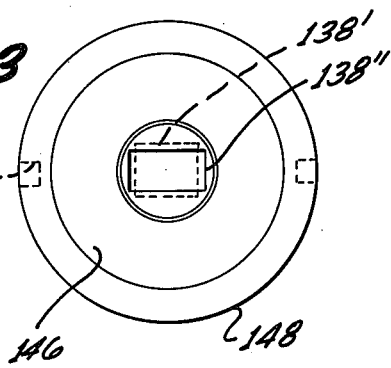

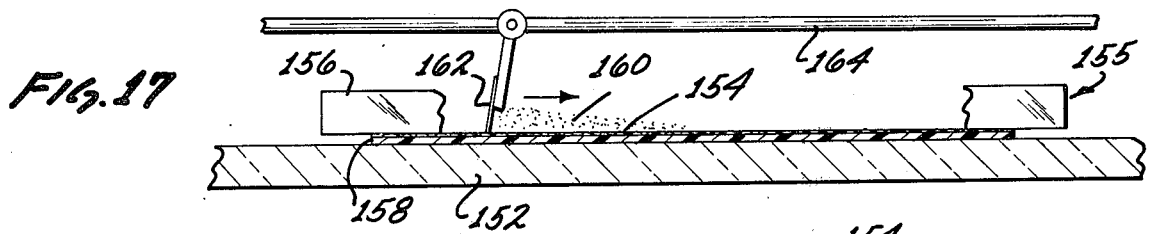
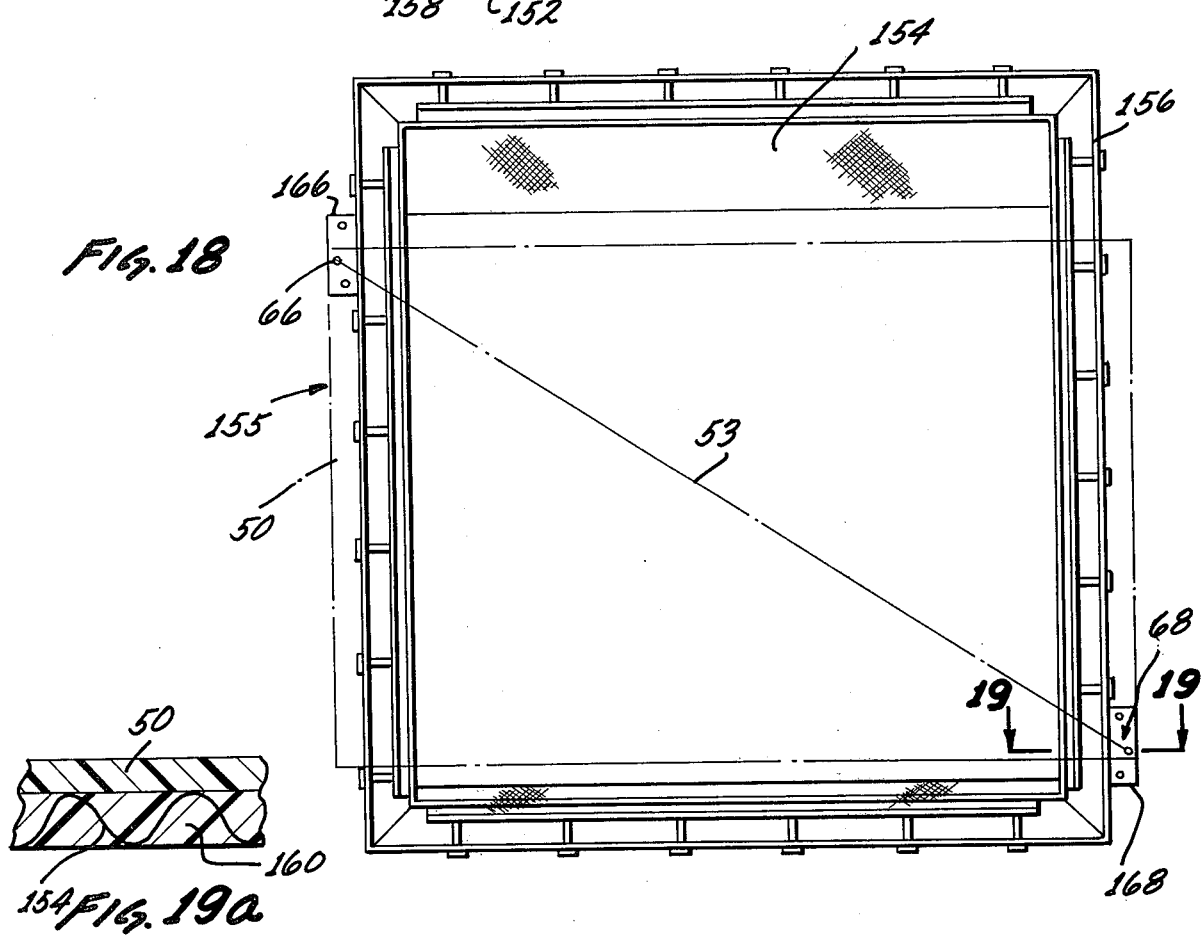
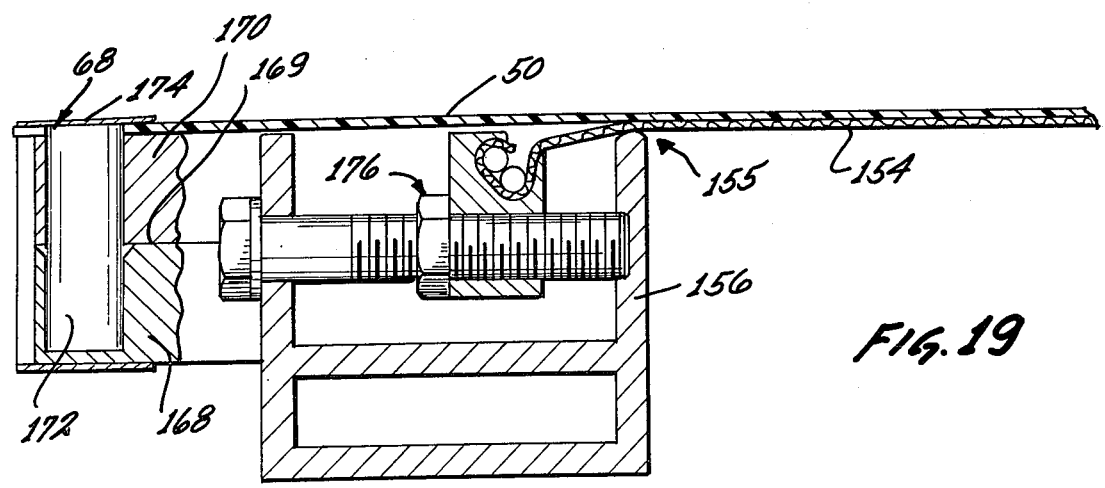

FIG.22
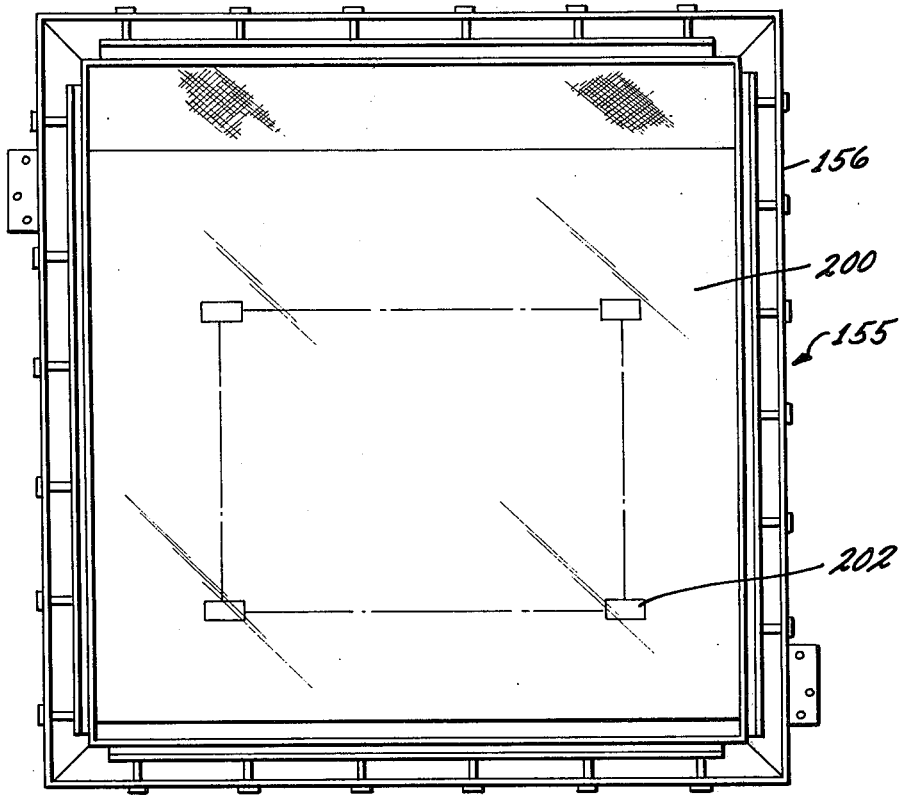
FIG.23
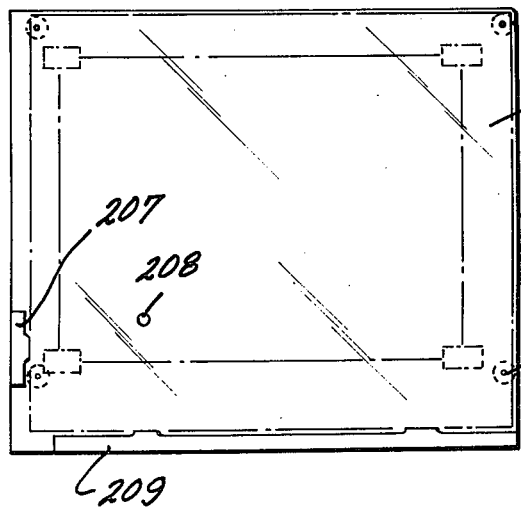
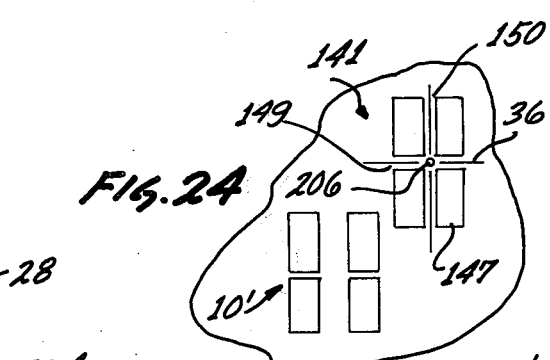
FIG.24
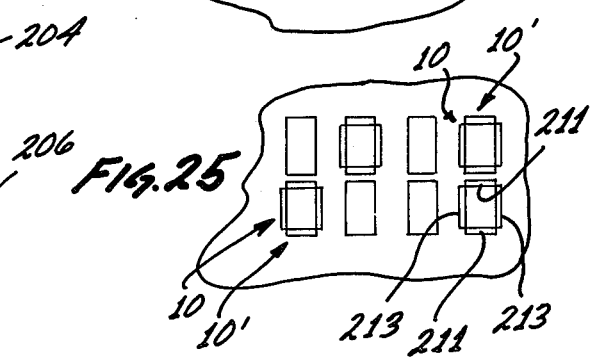
FIG.25

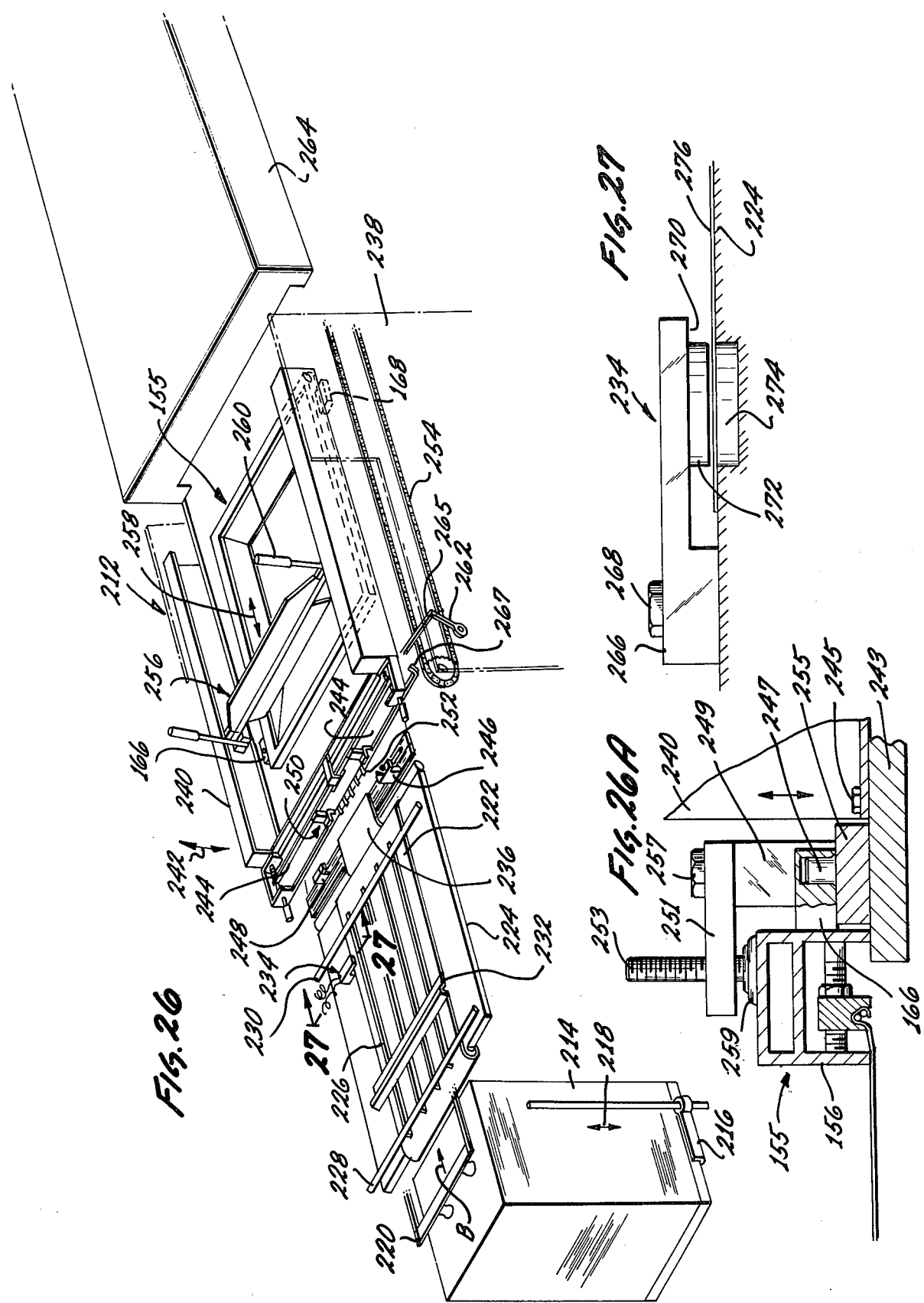

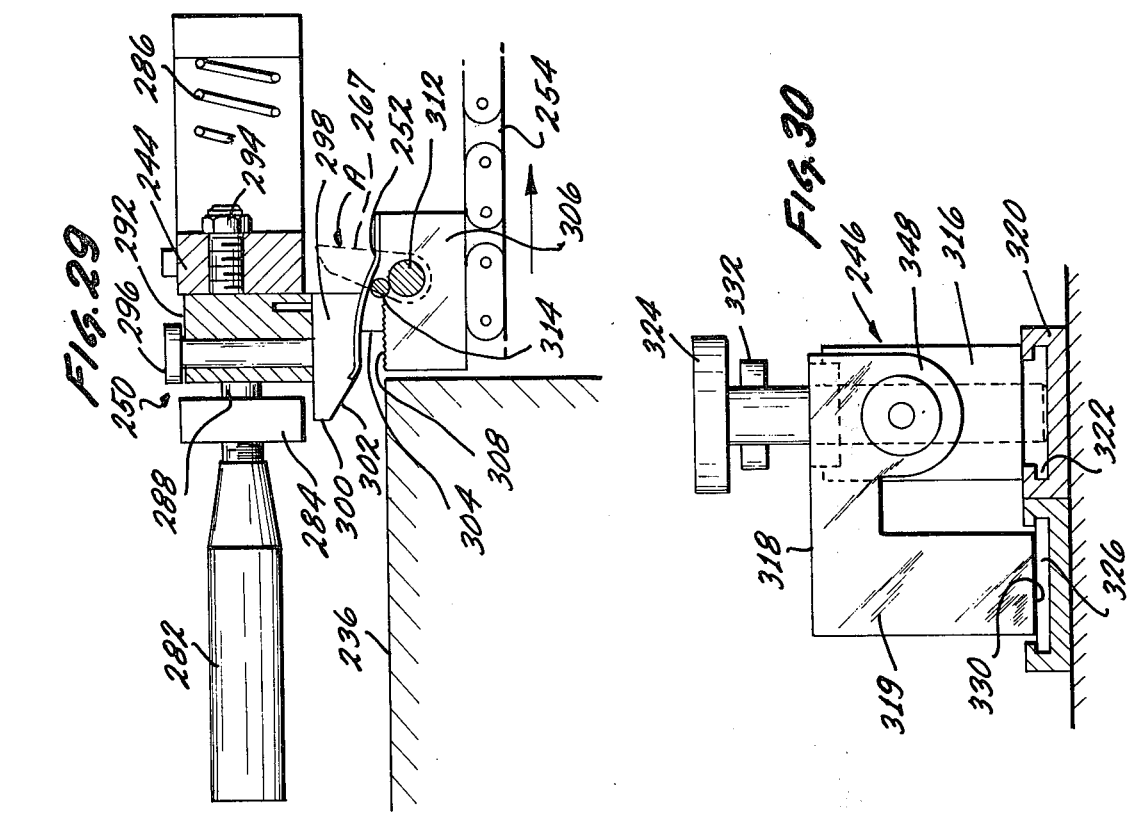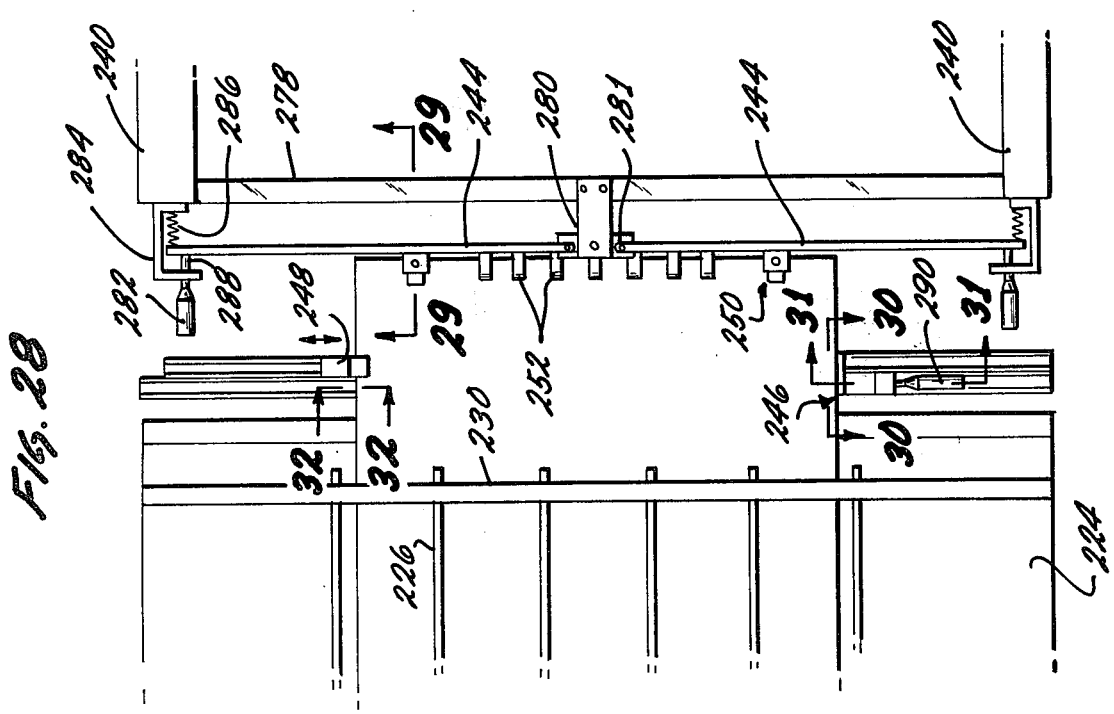

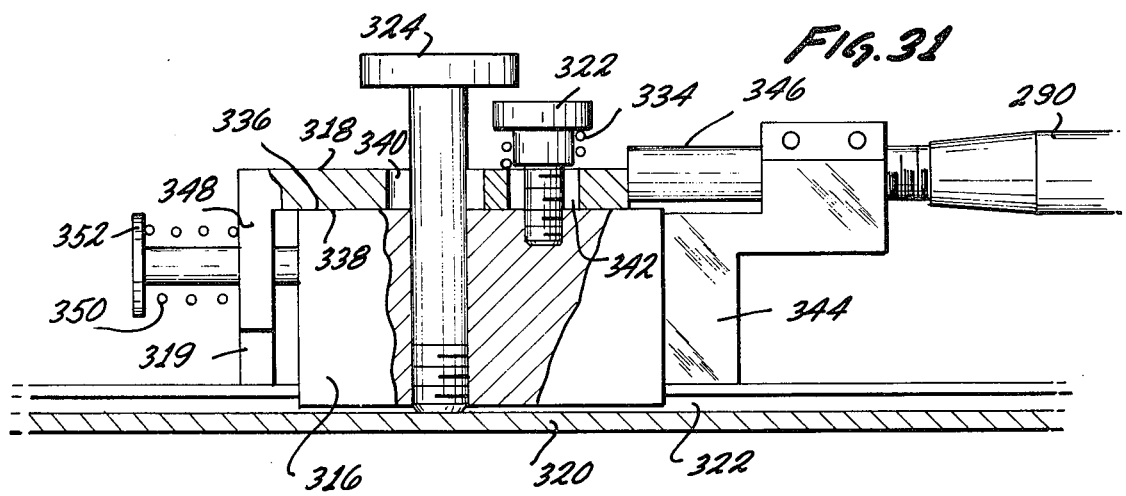
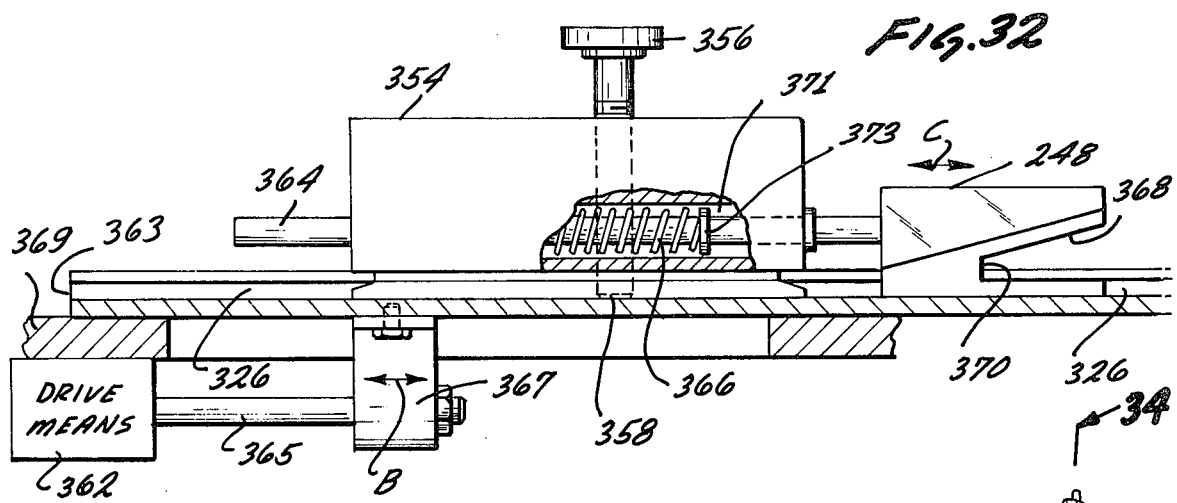
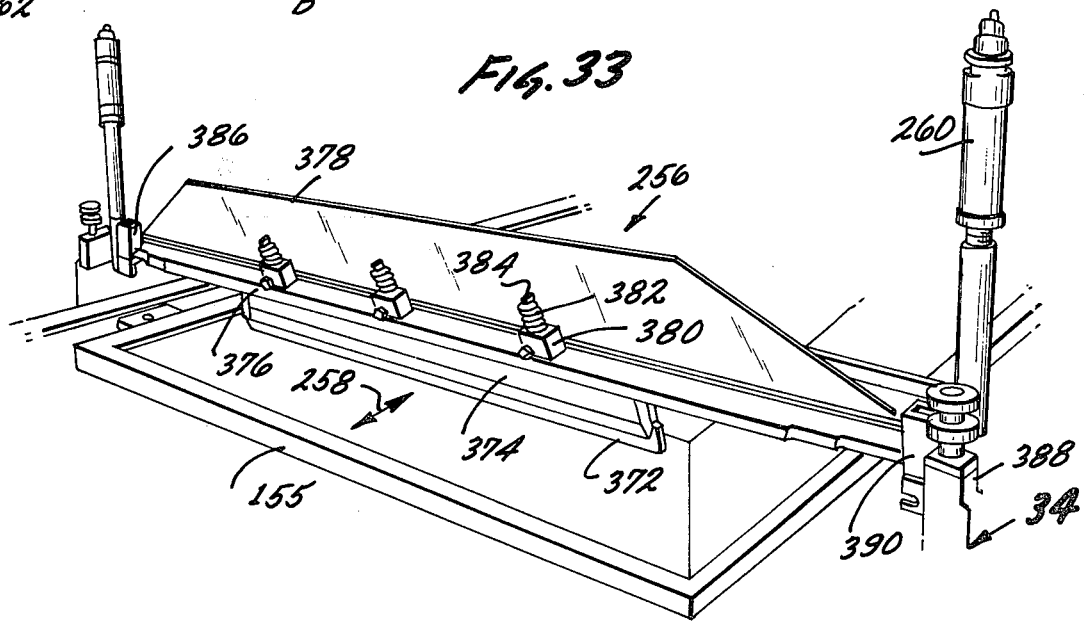

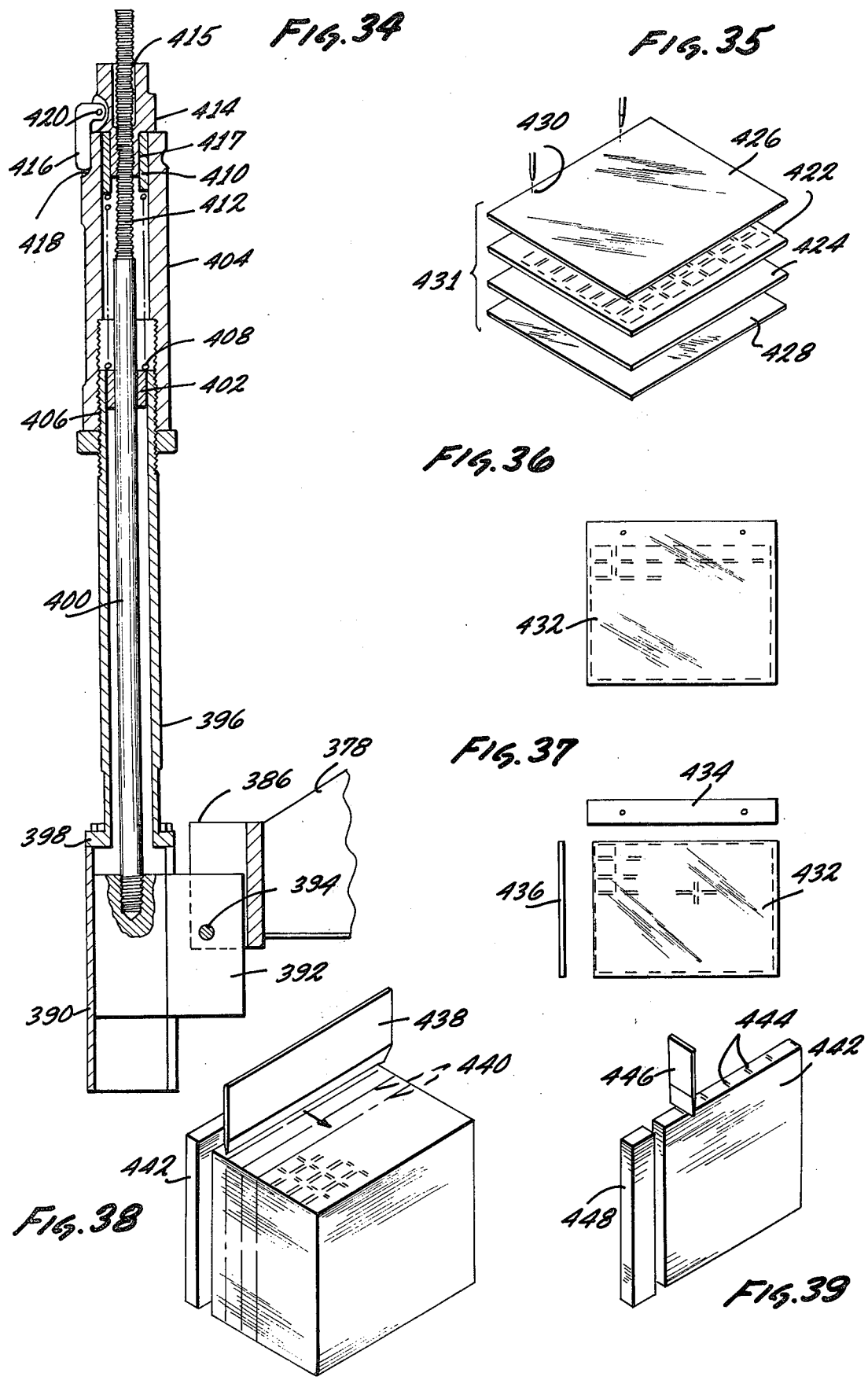

PROCESS OF SCREEN MANUFACTURE AND USE FOR CODING CREDIT CARDS

PRIOR APPLICATIONS

This application is a continuation-in-part of my prior copending applications Ser. No. 223,272, filed Feb. 3, 1972 now U.S. Pat. No. 3,802,101 and Ser. No. 273,434, filed July 20, 1972.

BACKGROUND OF THE INVENTION

The use of credit cards has become wide spread such that a wide variety of goods and services are purchased with credit cards. The latest development in the evolution of credit cards is the multi-purpose credit card which is honored by a large number of businesses over a wide geographical area. Multi-purpose credit cards are now issued by banks and keyed to the holder's account at the bank. With this arrangement, purchases made by the credit card holder may be simply debited against his account with the bank. This is very convenient and eliminates the disadvantages previously involved in the use of limited-purpose credit cards which were only honored by a single store and required issuance of a separate monthly statement and a separate payment.

The use of multi-purpose credit cards has increased losses by businesses through use of fraudulently acquired or stolen credit cards. A multi-purpose credit card is more difficult to police than a limited-purpose credit card since it is used over a wider geographical area and is honored by a large number of businesses. Thus, when a multi-purpose credit card is stolen, it may be necessary to notify thousands of individual businesses throughout the world of the theft.

Recent legislation has reduced the ability of a multi-purpose credit card issuer to pass on the risk of loss to the credit card holder. Previously, this risk was borne to a substantial extent by the credit card holder who could protect himself by carrying credit card insurance. To safeguard the credit card issuer, it is now imperative that a multi-purpose credit card be constructed that is substantially fraud-proof and whose usage can, therefore, be readily policed.

There is presently under consideration the use of multi-purpose credit cards whose usage will be keyed to a central computer. Individual businesses honoring a particular credit card will have a readout device on the premises which will be keyed to the central computer. Before honoring the credit card, it will be inserted into the readout device which will transmit the information on the credit card to the computer. Within a relatively short period, the computer will then either authorize use of the credit card or inform the businessman that the particular credit card has been reported stolen and should not be honored.

The use of such a computerized system may also provide information on the purchasing limits permitted with a particular credit card or whether the credit card holder is in arrears in his payments. Also, the computer may contain information which would indicate a purchase by the credit card holder which was completely inconsistent with his previous purchasing pattern. Given such a computerized system, the use of multi-purpose credit cards will be much more effectively policed to reduce losses from fradulent use.

In devising a multi-purpose credit card for use in a computerized system, it is imperative that the credit card be substantially fraud proof so that it may not be altered to provide false information for the computer. One suggestion has been to merely punch holes in the credit card with the arrangement of holes providing a readout code for the computer. Such a credit card would not be satisfactory because the holes could collect dirt or other debris which would interfere with the readout of information on the credit card. Also, a hole pattern could be easily altered to provide false information for the computer.

A second form of construction which has been suggested is to place a strip of magnetic material on the surface of the credit card with the orientation of magnetic particles in the strip containing coded information which could be read and transmitted to a central computer. This type of credit card construction is also unsatisfactory since the coded information could be altered to provide false information for the computer. For example, by passing the magnetic strip beneath a magnetic head, the magnetic strip could be erased with new and false information then being placed on the strip to confuse the computer.

A still further form of construction which has been suggested is to place bits of magnetic material at preselected locations within a credit card. This type of card is also not satisfactory because it would be difficult to construct and also difficult to read due to the presence of an overlying layer of plastic material.

In providing an essentially fraud-proof credit card, as disclosed in my prior copending U.S. applications Ser. Nos. 223,272 and 273,434, I have devised a card that is constructed with coded information spaces buried within the interior of the card which are concealed from view by the naked eye. The coded information spaces alter the transmissivity of the credit card to radiant energy. Thus, when a surface of the card is exposed to radiant energy, the position of the information spaces may be determined by a radiation sensor placed on the other side of the card which senses a reduction in the radiant energy level or an absence of radiant energy at the location of the coded information spaces.

In providing a credit card with coded information spaces within the card's interior, it is necessary that the information spaces be positioned very accurately. The information spaces must be positioned very accurately with respect to each other and also with respect to the edge or edges of the credit card which are used to position the card with respect to a card reader.

In providing credit cards with coded information placed within their interiors, it is necessary that the cards be capable of mass production to be cost-competitive with existing credit cards. Also, it is necessary that the cards be produced very accurately. Most mass production operations are not characterized by extreme accuracy which is generally not a problem since the goods being manufactured do not require extreme accuracy to function for their intended purpose. However, that is not the case with the present product where the slightest inaccuracy can render the product unusable. Thus, to make the present credit card a useful reality, it is necessary to provide a process which is extremely accurate and yet is capable of mass producing credit cards at a reasonable price.

SUMMARY OF THE INVENTION

In devising a process for the production of credit cards having coded information within their interiors, a number of possible constructions and methods of production were considered. After extensive evaluation of the various possible procedures, it was decided to focus on the use of a printing procedure for delineating coded information on the back surface of a piece of translucent plastic. The piece of plastic would then be laminated to a corresponding piece of plastic to form the finished credit card. If coded information spaces printed on the piece of plastic could be made sufficiently opaque, the location of these spaces could then be determined by exposing the surface of the card to radiant energy. A radiation sensor placed on the opposite side of the card could then be used to sense a reduction in the radiation energy level or the absence of radiant energy at the locations of the coded spaces within the card.

After deciding to focus on the use of a printing procedure to produce the desired credit card, it was found that available printing procedures did not provide the accuracy demanded in the production of the card. Also, it was found that many printing procedures were not capable of laying down a high density of ink per unit area as required to delineate coded spaces within the card which could be read without interference from offset printing on the exterior surface of the card. All of the various credit cards presently in use have offset printing on their exterior surfaces to identify the credit card issuer and to give the particular card a distinctive appearance. Thus, it was determined that, whatever procedure was devised, it would have to compatible with the use of offset printing on the exterior surfaces of the credit card.

After much experimentation, it was decided that silk screen printing might provide an answer to the problem if a silk screen printing procedure could be developed which would provide the accuracy required. Silk screen printing uses a fine mesh screen having a water-insoluble coating which will not transmit ink. The areas to be printed are defined by openings in the water-insoluble coating. When ink is placed on the silk screen, the ink is then forced through the openings in the screen through use of a squeegee applicator. The ink passes through the openings and is conveyed to the surface of a sheet placed beneath the silk screen. In devising a very accurate silk screen printing procedure for forming credit cards, it was determined that the silk screens could be accurately prepared through use of a master having small predetermined coded areas on the master corresponding to coded apertures to be formed in the silk screens. It was also determined that silk screens could be accurately prepared through a photographic process. In the present process, the first step in forming a silk screen involves placing a sheet of photographic film in contact with a flat table. The table is capable of X–Y positioning movement and can be moved to any desired location beneath an exposure head positioned above the table. The X–Y positioning movement of the table may be controlled in a standard manner through a computer so that the table may be accurately positioned at a number of predetermined locations for exposure of coded spaces on the film by the exposure head.

After moving the table to a desired location beneath the exposure head, a small space on the film is then exposed in a very precise manner such that the area and position of the exposed space is precisely controlled. The exposure head includes a small aperture having the same size and configuration as the space to be exposed on the film. During exposure of the film, the exposure head is preferably moved into very close proximity with the film so that the aperture opening in the exposure head is almost touching the surface of the film. An illumination source within the exposure head may then be actuated to momentarily expose the small area on the sheet of film to intense light. By placing the aperture opening very close to the surface of the photographic film, the exposure of the film is confined to the desired space without exposure of other portions of the film. By repeating this operation a number of times, a plurality of small precisely positioned information spaces may be exposed on the surfaces of the photographic film.

To provide the accuracy demanded in the process, it was determined that some means would have to be devised for keying the overall process to a common basis or measurement which could then serve to tie the process steps together in achieving the required accuracy. If some common basis could not be devised, it was determined that the process could not be made sufficiently accurate since small errors which might be introduced in each step of the process could then become cumulative to give a combined error which would be unacceptable.

The common basis which was devised for the steps in the process involved the position of the sheet of photographic film with respect to the exposure table. If locating means were provided on the sheet of film with the locating means having a precise relation to the exposed spaces on the film, these same locating means could then be used in positioning the developed film with respect to a silk screen in producing an image on the screen. This would key the accuracy of imaging the screen to the accuracy achieved in exposure of the photographic film. Lastly, if this same basis could then be used in positioning the imaged silk screen in a silk screen press, the accuracy of the printing operation would also be keyed to the exposure of the sheet of photographic film. By using the same basis for accuracy throughout the entire process, the effect of cumulative errors could then be avoided.

In exposing small predetermined coded spaces on the sheet of photographic film in the present process, locating means are, thus, formed on the film and the position of the film on the surface of the exposure table is fixed by the locating means. Conveniently, the locating means may take the form of first and second diagonal locating openings which are formed in the film when it is flattened against the exposure table. The first opening is preferably circular and is positioned adjacent a corner of the sheet of film and also positioned diagonally opposite the second opening. The second opening preferably defines an elongated slot having an axis which coincides with a diagonal passing through the first and second locating openings.

During subsequent usage of the film in imaging a silk screen, the developed film is positioned against the frame of the silk screen by use of the first and second locating openings in the film. The screen frame includes means which define a pair of diagonally positioned circular alignment openings and the film is positioned with respect to the frame by inserting locating pins through the alignment openings and the locating openings. In this manner, the basis for positioning the film with respect to the silk screen frame is the same as the basis for positioning the film with respect to the exposure table.

In the use of photographic film in the present process, there may be some minor stretching or expansion of the film through changes in temperature, etc. To accommodate minor stretching or expansion, while still permitting the film to lie flat during use in imaging a silk screen, the locating means on the film preferably fix one position on the film and also the position of a diagonal line on the film. Then, if the film stretches or expands, the stretching or expansion is directed along the diagonal line. This reduces the distortion of the film through stretching or expansion and also permits the film to lie flat during usage in imaging a silk screen.

In fixing one position on the film and also a diagonal line on the film, the first locating opening is preferably circular while a second locating opening is preferably oval or elongated. The diagonal line on the film then passes through the first and second locating openings with the second opening defining straight side surfaces which are parallel to each other and also to the diagonal line on the film. When the film is then places against a silk screen frame with the locating openings in the film aligned with alignment openings in the screen frame, the locating pins passing through the first and second locating openings and the alignment openings are preferably circular in cross-section. The locating pin passing through the first locating opening may uniformly contact the circular surface of the first locating opening to fix the position of the opening. However, the pin passing through the second locating opening preferably contacts only the parallel side surfaces defined by the opening. Thus, stretching or expansion of the film along the diagonal line may be permitted through movement of the elongated second locating opening with respect to the circular locating pin in engagement with the parallel straight side surfaces.

In carrying forward the same basis for accuracy into printing of a plastic sheet, the imaged silk screen is positioned on a silk screen press by use of the alignment openings on the silk screen frame. The press includes means whose placement corresponds with the placement of the alignment openings on the silk screen. Thus, the position of the screen with respect to the press is the same as the position of the photographic film with respect to the screen and the position of the photographic film with respect to the exposure table. By using this common basis throughout the process, the overall accuracy of the process is greatly improved to provide the extreme accuracy demanded in the formation of coded credit cards.

In forming credit cards in large numbers, information spaces may be silk screened into a plastic sheet which may subsequently be laminated to one or more additional plastic sheets to form a single structure. The single structure may then be uniformly cut to form a number of credit cards. In screen printing coded information on a credit card sheet, it is preferable that the coded information be printed on the sheet through multiple silk screen printings. Thus, a portion of the coded information spaces may be printed on the sheet in one printing, a further portion in a second printing, etc. By printing of the sheet in this manner, the total number of printing steps may be greatly reduced.

When coded information spaces are printed on a credit card sheet through multiple silk screen printings, the need for accuracy is increased even further. In multiple printings, the information spaces printed on the sheet in one printing must be correctly aligned with information spaces from a second printing, and so on.

As the number of multiple printings and the number of processing steps applied to each sheet is increased, the possibility of cumulative errors is also increased.

In providing extreme accuracy, a coded test screen may be used which has coded test apertures that correspond to the number and position of all of the predetermined available spaces on the photographic film for encoding information. The coded test screen may then be used to screen print coded test spaces on the back surface of a credit card sheet. This provides a test pattern composed of the test spaces corresponding to all the available predetermined spaces on the back surface for encoding information. The credit card sheet may include offset printing on its front surface to define locating symbols, e.g., a crosshair pattern, and a plurality of credit card areas. In addition to coded test spaces screen printed on the back surface of the credit card sheet, locating spaces may also be screen printed on the back surface. The position of the locating spaces with respect to the coded test spaces may be the same as the position of the locating symbols on the front surface of the sheet with respect to the credit card areas on the front surface. Thu,, the relative position of the locating symbols and locating spaces may be used in comparing the relative position of the credit card areas and the coded test spaces.

After screen printing the back surface of a credit card sheet to form locating spaces and coded test spaces on the back surface, the alignment of the locating spaces and the locating symbols is checked. If the locating spaces are not in alignment with the locating symbols, a new test sheet may be screen printed with the press being adjusted, if necessary, to bring the locating spaces on the back surface into alignment with the locating symbols on the front surface. When the locating spaces have been brought into alignment with the locating symbols, a number of test sheets may be prepared.

The test sheets may be used to check the position of a silk screen within a silk screen press during screen printing of information spaces on credit card sheets. For example, a first information screen may be positioned on the press with alignment openings in the screen aligned with locating means on the press. Thereafter, the back surface of a test sheet may be overprinted with information spaces may be checked by comparison with the location of coded test spaces on the sheet. If the coded information spaces are not aligned with the coded test spaces, the press may then be adjusted to the extent necessary to bring printing of the coded information spaces into alignment with the screen printed test spaces. The press is then properly adjusted and may be used to print the coded information spaces on a number of credit card sheets in a production printing.

As stated, it is preferable that coded information spaces be screen printed on the back surface of credit card sheets by a plurality of silk screen printings. The use of a test sheet is very useful in multiple silk screen printing. Thus, in positioning a second information screen on the silk screen press, the screen may first be used to overprint the back surface of a test sheet with coded information spaces. These coded information spaces are then compared with the position of the coded test spaces and the press may be adjusted, as necessary, to align the coded information spaces with the coded test spaces. When this has been done, the second silk screen may be used to print second information spaces on the back surfaces of a number of credit card sheets. The described operation may be repeated for a third printing, fourth printing, etc., using a third information screen, a fourth information screen, etc. Test sheets may be used to check the position of the third information screen, fourth information screen, etc., before beginning each production printing.

In the present process, the silk screen printing of credit card sheets is carried out very accurately. Thus, it is preferred that the silk screening press include several modifications which make its operation more accurate.

In general, the press used in the process is a conventional press. However, to improve its accuracy, it is desirable that the gripper edge and guide edge of the credit card sheets be more accurately positioned with respect to the press opening before the sheets are pulled into the press for printing. In providing more accurate positioning of the gripper edge, a stop bar may be positioned adjacent the opening to the silk screen press with micrometer adjustments for moving the stop bar toward or away from the press opening. Gripper edge stops may be secured to the stop bar with the gripper edge stops each including an abutment surface for contact with the gripper edge of the sheet.

Two stop bars are preferably employed with each stop bar positioned adjacent the press opening and each stop bar being pivotally secured to the press at its inner end. Each stop bar has an outer end which is movable by a micrometer adjustment and the gripper edge stops are pivotally secured to the stop bars. In this manner, the gripper edge stops are free to rotate to bring the abutment surfaces on the stops into alignment with the gripper edge of the sheet.

In improving the accuracy of the printing operation, an adjustable guide edge stop may be positioned adjacent the opening to the press to contact the guide edges of the plastic sheets. A pusher of standard construction may be used to move the sheet laterally in bringing the guide edge of the sheet into contact with the guide edge stop. The guide edge stop may include a micrometer adjustment to permit very accurate positioning of sheets with respect to the silk screen press.

During silk screen printing, ink is forced through apertures or openings in a silk screen surface by a squeegee ink applicator. During actuation of the squeegee applicator, there may be some tendency for the applicator to bow in its mid-portion. Also, there may be some tendency for the downward force exerted by the applicator against the silk screen to be nonuniform. Either of these conditions may interfere with the precision of the silk screen printing.

In improving the accuracy of the silk screen printing, stiffening means may be used on the squeegee applicator to minimize bowing of the applicator during printing. Also, stabilizing means may be employed with the squeegee applicator to provide a uniform yieldable downward force on the applicator during silk screen printing.

As discussed previously, the first step in the overall process is the accurate exposure of small spaces at predetermined locations on a sheet of photographic film. To provided great accuracy in the exposure of the film, the present process employs a unique exposure system comprising a flat table for positioning the sheet of film, an exposure head above the table and means to move the exposure head relative to the table. The exposure head includes an ilumination source and a small aperture positioned to receive light from the illumination source. The exposure head is moved to bring the small aperture into very close proximity with the surface of the sheet of film. With the aperture in close proximity to the surface, means are provided to momentarily actuate the illumination source to expose a small space on the film corresponding in size and shape to the size and shape of the aperture. With the aperture of the exposure head very close to the film surface, theh light passing through the aperture is projected very accurately against the film. Thus, the only area on the film which is exposed is the small area which corresponds precisely in size and shape with the size and shape of the aperture.

THE DRAWINGS

To illustrate a preferred embodiment of the invention, reference is made to the accompanying drawings, wherein:

FIG. 1 is a perspective view of a credit card having encoded information spaces within the interior of the card which change the transmissivity of the card to radiant energy at the locations of the information spaces;

FIG. 2 is a plan view of an information space within the interior of a credit card illustrating the available areas which may be used for encoding of information;

FIG. 3 is a front view of a credit card sheet with printing on the front of the sheet defining locating symbols, a plurality of credit card areas and cutting lines between the credit card areas;

FIG. 4 is a back view of the credit card sheet of FIG. 3 illustrating the location of screen printed coded information areas on the back surface which are precisely aligned with the credit card areas defined on the front surface;

FIG. 9 is an enlarged perspective view of the exposure head and the manner in which it moves vertically with respect to the surface of the photographic film to expose only a small precisely predetermined space on the film surface;

FIG. 10 is a sectional view taken along line 10—10 of FIG. 9 which illustrates the structure of a microswitch assembly that momentarily actuates an illumination source within the exposure head when the exposure head is positioned closely adjacent to the surface of the photographic film;

FIG. 11 is a sectional view taken along line 11—11 of FIG. 9 showing the internal structure of the exposure head;

FIG. 12 is an enlarged sectional view taken along line 12—12 of FIG. 11 illustrating the manner in which an aperture plate defining an aperture opening is held with respect to the body of the exposure head;

FIG. 13 is a plan view of the aperture plate and spacer with an aperture opening having an elongated rectangular configuration for exposure of a test space or an aperture opening having a shortened rectangular configuration for exposure of an information space;

FIG. 17 is a vertical sectional view of a silk screen with a light-sensitive emulsion being forced into the interstices of the screen by a squeegee applicator;

FIG. 18 is a plan view of a silk screen in an inverted position with a sheet of developed film precisely positioned with respect to the silk screen frame through the use of locating means on the film;

FIG. 19 is a sectional view taken along line 19—19 of FIG. 18 showing the manner in which the photographic film is precisely located with respect to the frame of the silk screen press;

FIG. 19a is a detailed sectional view illustrating the position of the photographic film in a flattened condition against a fine mesh screen whose interstices are filled with a light-sensitive emulsion;

FIG. 22 is a plan view of the imaged silk screen after exposure to light followed by washing to remove unexposed emulsion at the screen locatinos which were protected from light;

FIG. 23 is a plan view of a check table having corner check lights and a center check light used in examining the location of screen printed spaces on a plastic sheet placed on the table;

FIG. 24 is a greatly enlarged partial plan view of test spaces and a locating pattern on the back surface of a plastic sheet laid with a crosshair test pattern on the front surface of the sheet places above a corner light on the check table to examine the position of the crosshair test pattern with respect to the locating pattern;

FIG. 25 is a greatly enlarged plan view of test spaces on a plastic sheet which are placed over the center light on the check table to view the position of the test spaces with respect to information spaces overprinted on the sheet in relation to the test spaces;

Figure 5:
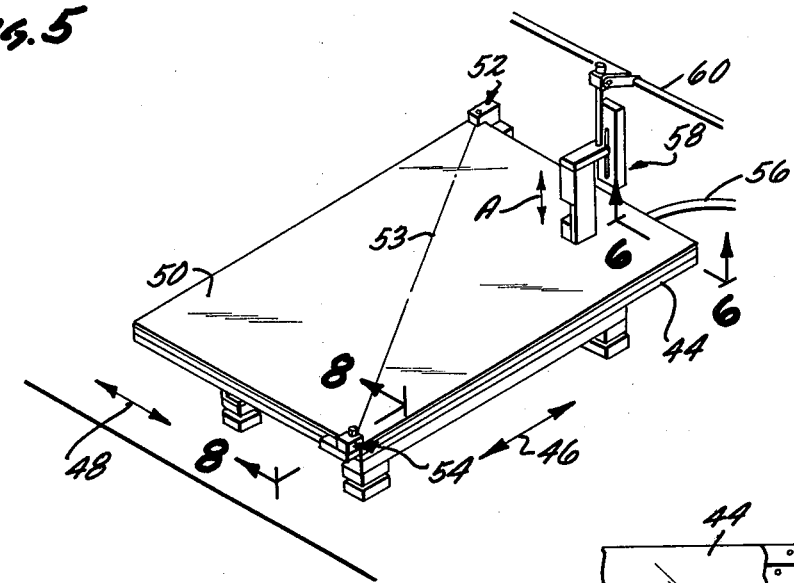
FIG. 5 is a perspective view of an indexing photographic table having a sheet of photographic film mounted thereon through locating means on the film with the table being indexable to predetermined positions relative to an exposure head positioned above the table.

FIG. 26 is a pictorial view of a silk screen press to illustrate the general operation of the press and the manner in which guide and gripper edges of a plastic sheet are precisely positioned with respect to the press opening; FIG. 26a is a detailed section view illustrating the manner in which a silk screen is positioned in the silk screen press by alignment pins on the press having the same relationship as the alignment apertures in the locating brackets on the silk screen;

FIG. 27 is a sectional view taken along line 27—27 of FIG. 26 of a thickness indicator that senses the presence of more than one thickness of a credit card sheet being fed to the press;

FIG. 28 is a partial plan view illustrating means for precisely positioning the guide and gripper edges of a plastic sheet adjacent to the opening to a silk screen press to ensure that the sheet is accurately positioned within the press;

FIG. 29 is a sectional view taken along line 29—29 of FIG. 28 of a gripper edge stop pivotally secured to a stop bar whose position may be varied through a micrometer adjustement;

FIG. 30 is a sectional view taken along line 30—30 of FIG. 28 showing a front view of a guide edge stop whose position may be precisely controlled to determine the position of the guide edge of a credit card sheet relative to a silk screen press;

FIG. 31 is a sectional view of the guide edge stop of FIG. 30 taken along line 31—31 of FIG. 28;

FIG. 32 is a sectional view taken along the line 33—32 of FIG. 28 which illustrates the construction of a guide pusher that provides a yieldable force to the edge of a credit card sheet in moving the guide edge of the sheet against the guide edge stop;

FIG. 33 is a pictorial view of a squeegee applicator used to force ink through a silk screen with the squeegee applicator being stiffened to prevent its bowing and squeegee stabilizers providing a uniform downward force of the squeegee blade against the screen;

FIG. 34 is a sectional view taken along line 34—34 of FIG. 33 illustrating the structure of a squeegee stabilizer which applies a downward resilient force to the squeegee applicator with the force being adjustable to vary the contact pressure between the squeegee blade and silk screen surface;

FIG. 35 is a pictorial view of a screen printed credit card sheet being tack-welded to a backing sheet with cover sheets positioned on either side of the credit card and backing sheets;

FIG. 36 is a plan view of a stack of laminated structures each of which nay contain several sheets as illustrated in FIG. 35;

FIG. 37 is a plan view illustrating first cutting operations in which a top cut and a side cut are removed from a stack of laminated sheet structures;

FIG. 38 is a pictorial representation illustrating the severing of a stack of laminated structures into a plurality of smaller structures by horizontal cuts through the stack, and FIG. 39 is a pictorial representation of the smaller stacks provided by the cutting operation of FIG. 38 being severed further through a plurality of cuts too form stacks of individual credit cards.

DETAILED DESCRIPTION

A credit card 2, produced by the present process, is illustrated in FIG. 1 in which coded information is contained in the interior of the card within an information area 4. As will be described, the credit card 2 is formed of laminated plastic sheets which are translucent. The coded information within the information area 4 is formed by screen printing on the back surface of one of the translucent plastic sheets. When the plastic sheets are laminated together, the coded areas are buried within the card interior.

The screen printed areas have a lower transmissivity to radiant energy than the balance of the card. When one side of the card is exposed to radiant energy, a radiation sensor on the other side of the card is, thus, able to sense the absence or a decrease in the radiation level at card locations which have been screen printed.

In forming a credit card according to the present process, coded information for a large number of cards, such as 100 cards, is screen printed on the surface of a plastic sheet. After the plastic sheet has been screen printed, the sheet is then divided into uniformly sized pieces, each of which has been printed with coded information for one credit card.

FIG. 2 illustrates the areas or spaces 10 which may be screen printed in encoding a single card to provide the card with a unique number which identifies the card and its holder. Since the coded information is buried within the interior of the card, it is not visible to the naked eye and the card is essentially tamper-proof since it would be necessary to destroy the card to reveal the encoded information spaces.

As shown, a top plastic sheet 6 has screen printing on its back surface 8 to define information spaces 10 whose transmissivity to radiant energy is less than that of the material forming the sheet. Clock track spacers 12 may also be screen printed on the back surface 8 with the clock track spaces used to activate a card reader as described in my prior copending application Ser. No. 242,382, filed Apr. 10, 1972, the disclosure of which is incorporated herein by reference.

The information spaces 10 may be arranged in a number of vertical columns with columns 14 indicating the position of the card on the plastic sheet from which it is prepared. Columns 16 may be used to indicate the sheet number, and columns 18 may be used to indicate the run number. The information spaces 10, by being arranged in columns, may be utilized to convey a binary code with the information in each column representing a particular number. Thus, for example, space 20 may be used to represent the numbers 0 or 1 with the space being blank for 0 and screen printed to represent number 1. Similarly, space 22 may be used to represent the numbers 2 or 0 with the space being screen printed to represent 2 or left blank to represent 0. Space 24 may similarly be used to represent the numbers 4 or 0 and space 26 may be used to represent the numbers 8 or 0.

As described spaces 20, 22, 24 and 26 may be used to represent a number from 0 to 9 with all of the spaces in a column left blank to represent 0, spaces 20 and 24 being screen printed to represent 5, and spaces 26 and 20 being screen printed to represent 9, etc. Each of the columns of information spaces 10 may be used in the manner described so that each column represents a number ranging, for example, from 0 to 9. In this manner, the card identification columns 14 may be used to identify 100 cards numbered from 00 to 99 which are screen printed on a single sheet of plastic. Similarly, the sheet identification columns 16 may be used to identify a particular sheet with the sheet being numbered from 0000 to 9999 in a run of 10,000 sheets. Lastly, the run identification columns 18 may be used to identify a particular run with the runs being numbered from 00000 to 99999 in a total of 100,000 individual runs.

The individual card number, using the available information spaces 10 shown in FIG. 2, may range from 00000000000 to 99999999999. Thus, the available combination of information spaces 10 may be used to provide card numbers for 100,000,000,000 individual cards.

FIG. 3 illustrates a plastic top sheet 28 in which the front surface 29 has been sub-divided into credit card areas 30 with each area containing offset printing 32 that identifies the credit card issuer, etc. The offset printing 32 is formed from an ink layer of much less density than the ink layer of the screen printed areas within the interior of the card. Thus, the card may be read even though the offset printing 32 may be placed in overlying relation to the information spaces 10 within the card interior.

The credit card areas 30 on the front surface 29 are separated by parallel cutting lines 34. As will be described, after coded information has been screen printed on the back surface of top sheet 28, the top sheet is tack welded and then laminated to a corresponding rear sheet and individual credit cards are cut from the laminated sheets. It is important that the information areas 4 (see FIG. 1) within the card 2 be precisely positioned with respect to the edges of the card since the card edges are used as guide surfaces in placement of the card within a card reader. Thus, it is important that cutting of the individual cards be done accurately. The spacing of the parallel cutting lines 34 may be used to insure that cutting of the individual cards is done accurately since the spacing between the cutting lines is only slightly greater than the width of the blade used for cutting the cards. If the cutting blade is placed precisely at the midpoint between parallel cutting lines 34, the individual cutting lines will appear on either side of the cut. However, if the cutting blade is positioned slightly off center, the cut will partially or completely remove one of the cutting lines 34. This will then indicate that the cards have been cut incorrectly and they will be scrapped and not be sent out to the customer.

In addition to cutting lines 34, the front surface 29 also includes crosshairs 36 positioned at each of the four corners of the area on the front surface used to define credit card areas 30. The edges of the sheet 28 are trimmed off during cutting of the cards by cutting through the crosshairs 36. In addition, the crosshairs 36 are used in determining the correct placement of screen printed coded information on the back surface of sheet 28. Through use of the crosshairs 36, coded information which is screen printed on the back surface of the sheet 28 is correctly aligned with the offset printing 32 and cutting lines 34 which are offset printed on the front of the sheet.

During screen printing of coded information on the back surface of sheet 28, the sheet is moved and guided through a screen printing press. During this movement, the sheet 28 is gripped at a gripper edge 38 and pulled into the press after first being correctly positioned with respect to the press by a guide edge 40. To insure the accuracy required for the present process, it is important that the gripper edge 38 and the guide edge 40 be cut straight and be positioned at a right angle with respect to each other. The offset printing 32, cutting lines 34 and crosshairs 36 on the front surface 29 are precisely positioned with respect to the guide and gripper edges 40 and 38.

FIG. 4 illustrates the rear surface 42 of sheet 28 with screen printed information areas 4 on the rear surface 42 corresponding to each of the credit card areas 30. The crosshairs 36 are not printed on the rear surface 42. However, by shining a light against the front surface 29, the location of crosshairs 36 is made visible on the rear surface 42 to check the placement of information areas 4 on the rear surface. The manner in which this is done will be described subsequently.

In the practice of the present process, screens are prepared for silk screen printing of coded information on the back of a plastic sheet with the sheet then being processed further to form individual credit cards. The precise location of information areas 4 on the plastic sheet is of great importance and requires that the silk screen printing be carried out very accurately.

FIG. 5 illustrates the first step in a photographic process for formation of a silk screen which uses an exposure table 44 movable in the direction of arrows 46 for positioning along the Y-axis and movable in the direction of arrows 48 for positioning along the X-axis. A sheet of unexposed film 50 is placed against the table 44 and is then drawn flat against the table by a vacuum force exerted through a vacuum line 56. With the film 50 flat against table 44, the position of the film is then fixed by locator brackets 52 and 54 mounted on the table. As will be described, locator brackets 52 and 54 fix the position of one point on the film 50 adjacent locator bracket 52 and also fix the position of a diagonal line 53 running between the locator brackets.

After fixing the position of the sheet of unexposed film 50 with respect to table 44, the table is then moved in a precise manner by an X-Y positioner controlled by a computer so as to move the table to pre-selected locations with respect to an exposure head assembly 58 carried by a rotatable actuator shaft 60. After precisely positioning table 44 and film 50 with respect to the exposure head assembly 58, the exposure head assembly is moved vertically downward as indicated by arrows A to bring the assembly into close proximity with the film. A small portion of the film 50 is then exposed to light through actuation of a light source within the assembly 58. The exposure table 44, film 50, exposure head assembly 58, etc., are all situated within a darkened enclosure. Thus, the only portions of film 50 which are exposed are those portions which are precisely positioned beneath the exposure head assembly 58.

Figure 6:
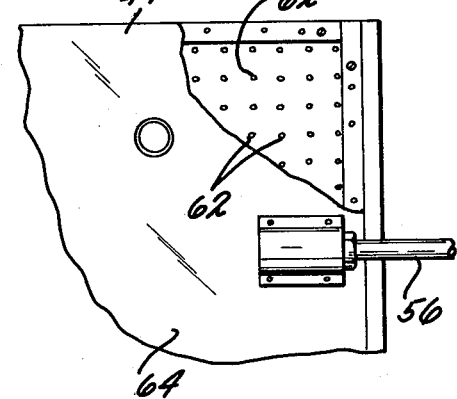
FIG. 6 is a view in partial section taken along line 6—6 of FIG. 5 to illustrate the construction of the exposure table and the manner in which a vacuum is drawn against the photographic film to hold it in a flattened position against the table.

FIG. 6, which is a partial sectional view taken along the line 6—6 of FIG. 5, illustrates the manner in which a vacuum is drawn through table 44 so as to hold the film sheet 50 against the table. As shown, table 44 contains a plurality of minute holes 62. A cover plate 64 is positioned below table 44 in spaced relation thereto and a vacuum is drawn through the line 56 into the region between the cover plate and table. This vacuum is then transmitted through holes 62 to pull the film sheet 50 tightly against the upper surface of table 44.

Figure 7:
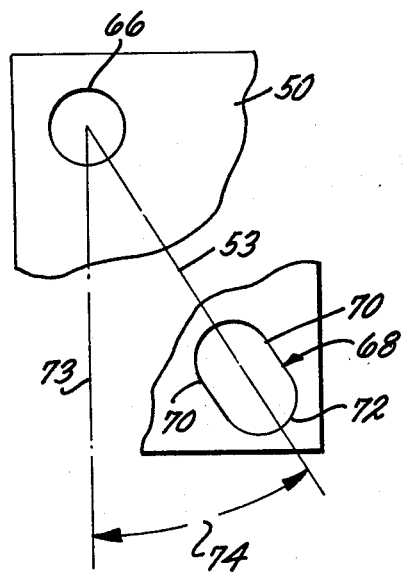
FIG. 7 is a partial plan view of a sheet of photographic film shown in FIG. 5 and the manner in which the film is located with respect to the exposure table to fix a point and also a diagonal line on the photographic film.

FIG. 7 is a partial plan view of the film sheet 50 which demonstrates the manner in which the film sheet is precisely positioned with respect to table 44. In positioning the film 50, a circular locating hole 66 is formed in the upper left-hand corner of the film sheet beneath locating bracket 52 while an oval locating hole designated 68 is formed in the sheet beneath locating bracket 54. The oval locating hole 68 includes a pair of parallel straight sides 70 which are joined together by curved portions 72. As indicated, parallel straight sides 70 are parallel to the diagonal line 53 which joins holes 66 and 68. The position of the straight sides, thus, fixes the angle 74 between the diagonal line and a vertical line 73 running through the center of hole 66.

During subsequent processing operations, the film sheet 50 may stretch slightly due to changes in temperature, etc. Minor stretching of the film sheet 50 is accommodated while maintaining the film in a flat position by permitting the film to elongate along the direction of diagonal line 53 with the position of hole 66 being maintained constant. To provide this result, circular locating pins, as will be described, are placed in holes 66 and 68. The pin inserted in hole 66 contacts the sides of the hole uniformly while the pin inserted in hole 68 contacts only the straight parallel side portions 70. This, then, permits relative movement of the film sheet 50 with respect to a circular pin within hole 68 while maintaining the position of the diagonal line 53 constant with respect to the fixed locating hole 66.

Figure 8:
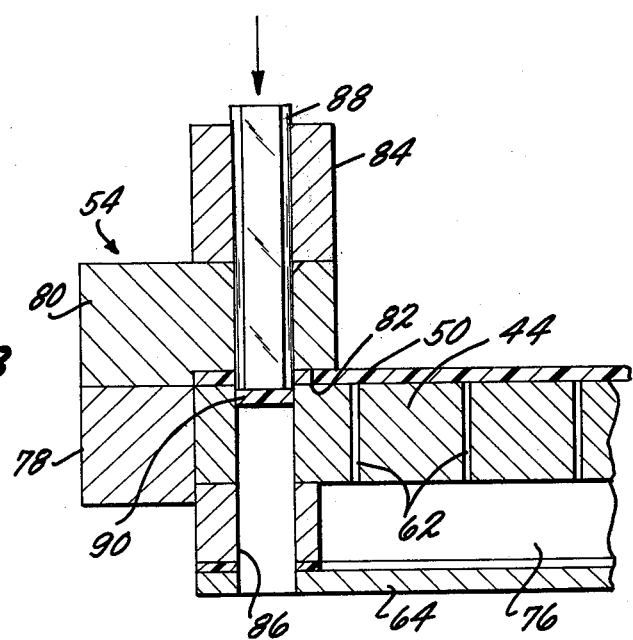
FIG. 8 is a sectional view taken along line 8—8 of FIG. 5 which illustrates the formation of an opening in the photographic film through use of a punch which may then serve to fix the film in a desired position with respect to the exposure table.

FIG. 8 illustrates the manner in which the locating holes 66 and 68 may be formed in the film sheet 50 when it is held by a vacuum force in a flattened position against exposure table 44. As described, a vacuum is drawn through the minute holes 62 in the table 44 from a vacuum space 76 formed between table 44 and cover plate 64. The locating bracket indicated as 54 includes a support block 78 secured to the table 44 in any suitable manner and a positioning block 80 having an upstanding portion 84 secured thereto. With the film sheet 50 flattened against table 44, the positioning block 80 and upstanding portion 84 are placed above the block 78 with a recessed portion 82 in the underside of block 80 positioned over the corner of the film sheet 50. With positioning block 80 and upstanding portion 84 thus positioned above support block 78, an aligned aperture 86 is formed through table 44, positioning block 80 and upstanding portion 84. A tubular punch 88 is then inserted into aperture 86 and is moved forcibly downward against the film sheet 50 to remove a cut film segment 90 therefrom and to form the oval locating hole 68 described previously. After formation of the hole 68 through downward movement of the punch 88, the punch may then act as a pin in securing the film sheet 50 to table 44 through contact of the exterior surface of the punch with the interior surface of the oval locating hole 68.

The locator bracket 52 indicated in FIG. 5 is not described in detail since its structure and function is the same as that of the locator bracket 54 shown in FIG. 8. The only point of difference is that the punch employed with the locator bracket 52 is circular and forms a circular locating hole 66 as opposed to the oval locating hole 68 formed by the oval punch 88.

FIG. 9 is a detailed pictorial view of the exposure head assembly 58 which was described previously in regard to FIG. 5. A support beam 92 positioned above the plane of exposure table 44 (see FIG. 8) has support blocks 94 positioned on its upper surface with the support blocks providing bearing surfaces for rotatable actuator shaft 60. A slide carriage 96 is secured to the front face of beam 92 and includes a pair of slide rods 98 that engage apertures (not shown) in a slide block 100. During vertical movement of the exposure head assembly 58, the slide block 100 slides relative to the slide carriage 96 with the movement of the slide block being controlled through its contact with slide rods 98.

A plate 102 is secured at its inner end to the slide block 100 to form a cantiilever beam construction which extends horizontally from the slide block. A head support 104 is secured to the underside of plate 102 and an actuating rod 106 extends upwardly from the slide block 100. The upper end of rod 106 is connected to a crank arm 108 extending from actuating shaft 60. In operation, shaft 60 is rototated slightly in a clockwise direction from its position shown in FIG. 9 to cause the actuating rod 106, slide block 100, head support 104, etc., to move downwardly. Upward movement of the rod 106, etc., is provided by partial movement of the shaft 60 in a counterclockwise direction.

An exposure head 110 is connected to the lower end of head support 104 and is moved upwardly or downwardly through movement of the head support. The exposure head 110 is shown in solid line drawing in its raised position and is indicated in phantom line drawing at 110' in its lowered position for exposure of a small information space on the film sheet 50. A microswitch assembly 112 carried at the top of the actuating rod 106 is automatically closed when the exposure head is in its down position 110' to momentarily actuate a diode within the exposure head.

The extent of downward movement of the slide block 100 relative to slide rods 98 and slide carriage 96 is controlled by a stop 116 positioned on a crossbar 114 between the slide rods. The stop 116 may be threadedly engaged with the crossbar 114 so that the stop may be raised or lowered to control the extent of downward movement of the slide block 100. The position of stop 116 is set to fix the level of the exposure head in its lowered position 110' with the exposure head positioned closely adjacent to the surface of the film sheet 50. This prevents the diffusion of light issuing from the exposure head in its lowered position 110' to provide close control of the exposed area on the film sheet 50.

FIG. 10, which is a sectional view taken along line 10—10 of FIG. 9, illustrates the inner structure of the microswitch assembly 112. The microswitch assembly 112 includes a switch actuating cap 118 that is supported through contact with the upper surface of actuating rod 106. The cap 118 includes an adjustment screw 126 in threaded engagement with the cap and a spacer 119 positioned within the cap. The vertical position of cap 118 relative to rod 106 may, therefore, be varied through rotation of adjustment screw 126 which, as will be described, controls the opening and closing of a microswitch 122.

The microswitch 122 is supported by a collar 120 positioned slidably about the rod 106. The collar 120 is carried at the end of crank arm 108 which is secured to the actuating shaft 60. Rotational movement of the shaft 60, thus, causes vertical movement of the crank arm 108 and the collar 120 secured thereto. With the exposure head in its raised position 110 as shown in FIG. 9, the crank arm 108 is in an upwardly inclined position with the collar 120 engaging the end surface of adjustment screw 126. As the actuating shaft 60 is rotated to lower the rod 106, the cap 118 moves downwardly with the rod and with the collar 120 in contact with the cap. Downward movement of the rod 106 ceases when the slide block 100 makes contact with the stop 116. At this point, the position of the crank arm and collar are illustrated in FIG. 10 as 108' and 120' with the collar in engagement with actuating cap 118.

With the downward movement of rod 106 interrupted through contact of slide block 100 with the stop 116, the crank arm continues to move downwardly to the solid line position indicated as 108 with the collar moving relative to the rod 106 to a solid line position 120. This causes the collar 120 and microswitch 122 to move away from the actuating cap 118. On movement of microswitch 122 away from cap 118, a switch contact 124 is moved away from a cap surface 125 and the switch 122 then closes to transmit electricity from an input conductor 127 through an output conductor 129 to the lowered exposure head 110' (see FIG. 9). Rotational movement of the shaft 60 is controlled such that the switch contact 124 is only momentarily moved away from the cap surface 125 with the shaft then reversing its direction of rotation to again bring the switch contact against the cap surface which breaks the electrical connection to the input head 110. This provides a momentary actuation of the exposure head 110 to expose a small portion of the film sheet 50 while the head is in its lowered position 110' in close proximity to the surface of the film.

FIG. 11 illustrates the internal structure of the exposure head 110 in sectional view taken along the line 11—11 of FIG. 9. The exposure head 110 includes a body 128 having a top plate 130 secured thereto in any convenient manner such as by a screw 132. The top plate 130 includes a diode holding member 134 having an aperture therein for support of a light-emitting diode 136. The diode 136 may be positioned within a cylindrical cavity 137 which is directed toward an aperture 138 through which light from the diode 136 is projected against a small area of the surface of the film sheet 50. As indicated, the exposure head 110 is positioned very close to the surface of the film sheet 50 in its lowered position with only a small gap 140 separating the lower surface of the exposure head from the upper surface of the film.

FIG. 12 is an enlarged sectional view of the aperture portion of the exposure head 110 taken along the line 12—12 of FIG. 11. The aperture 138 is defined by an opening in an aperture plate 148 secured within a recess 143 in the undersurface of the exposure head body 128. A plurality of holes 144 in the body 128 may be aligned with corresponding holes 145 in the aperture plate 148. A torroidal spacer 146 fits in a recess in the upper portion of the aperture plate 148 and the aperture plate is rotated until its holes 145 are in alignment with the holes 144 in body 128. At this point, pins 142 are inserted in the holes 144 and 145 to secure the aperture plate 148 to the body 128.

A plan view of the aperture plate 148 and spacer 146 is shown in FIG. 13. The aperture plate 148, as indicated, may define either one or the other of two different aperture openings 138 and 138". An aperture plate 148 having a shortened rectangular aperture opening shown in phantom line drawing as 138' is used to expose a square information space 10 (FIG. 2) on the film 50. However, an aperture plate 148 having a narrowed and lengthened rectangular aperture opening 138" is used to expose a test space on a test film sheet as will be described subsequently. A test silk screen is then formed from the test film sheet with the screen having rectangular openings therein corresponding to the rectangular opening 138''. The test silk screen is then used in an over-printing operation in which the location of information spaces 10 which are silk screened on a plastic sheet can be checked against the location of rectangular test spaces which are silk screened on the same plastic sheet.

Figure 14:
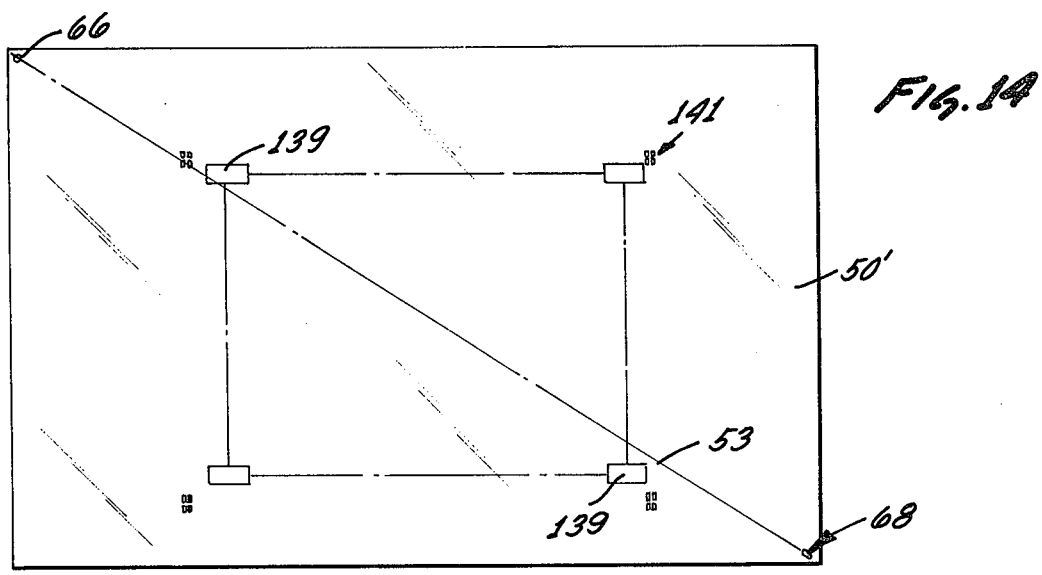
FIG. 14 is a plan view of a test sheet film having exposed test spaces on its surface which are positioned within test space areas and also a crosshair test pattern at the corners of the area containing the test space areas.

With regard to the use of a test film sheet having exposed lengthened rectangular spaces thereon, as opposed to the shortened rectangular exposed information spaces of the type shown in FIG. 2, FIG. 14 illustrates a test film sheet 50' having a plurality of test areas 139 thereon which are precisely exposed in the manner described in FIGS. 5–13. The test sheet film 50' also has a circular locator hole 66 at its upper left-hand corner and an oval locator hole 68 at its lower right-hand corner, as described previously, which fixes the location of the diagonal line 53 and the circular hole 66. Additionally, the test film sheet 50' includes an exposed crosshair test pattern 141 at each of the corners which bound the film portion containing the test areas 139.

Figure 15:
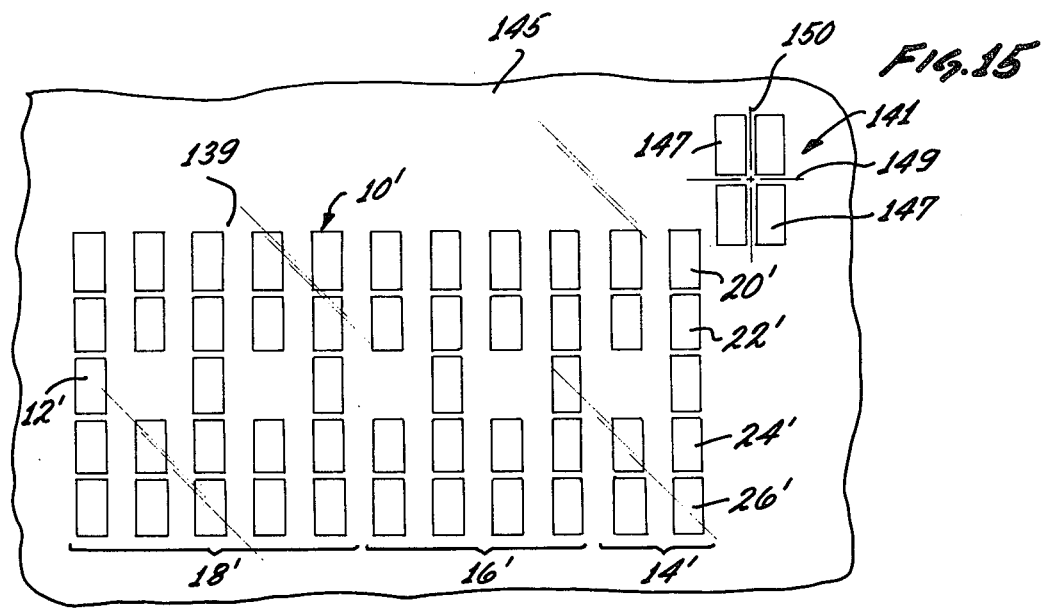
FIG. 15 is an enlarged plan view of a portion of the test sheet film of FIG. 14 showing the location of test spaces on the film within a test space area and the spatial relation of the test spaces with respect to a location pattern.

FIG. 15 illustrates in detail the appearance of a test sheet film portion 145 which includes the upper right-hand crosshair test pattern 141 and the test area 139 immediately adjacent thereto as shown in FIG. 14. It will be apparent that the appearance of the test sheet film portion 145 is very similar to that of the top sheet portion 6 described in FIG. 2. Since the test sheeet film 50' is formed to check the accuracy of the screen printing of information spaces 10 on the plastic sheet portion 6, the reference numerals used in FIG. 15 are the same as those in FIG. 2 except that prime designations have been used to distinguish test spaces from information spaces.

With reference to FIG. 15, a plurality of test spaces 10' are exposed within each of the test areas 139 with the test areas corresponding in number and placement to the information areas 4 (see FIG. 4) which are screen printed on a plastic sheet in the performance of the process. As described previously, each credit card which is formed by the process bears a unique coded identification number which is buried within the interior of the card. In providing a unique number on a particular card, only selected information spaces 10 (FIG. 2) are screen printed while other information spaces are left blank and the location of the screen printed spaces indicates the card number.

In the test areas 139 formed on test sheet film 50', all of the available spaces for encoding of information within the test areas are exposed. This permits a comparison of the location of the exposed test spaces 10' with any particular combination of information spaces 10 (FIG. 2) to designate a particular card number. As illustrated, exposed test spaces 10' have a narrowed and lengthened rectangular configuration. Thus, if a shortened rectangular information space 10 were placed directly on top of a test space 10', the information space would not completley cover the test space and small portions of the test space would remain uncovered. This is illustrated in FIG. 13 in which the shortened rectangular aperture 138' is shown in superposed relation to the lengthened rectangular test aperture 138''.

It will be observed from FIG. 13 that a screen printed area having the exact dimensions of aperture opening 138' would not completely cover a screen printed area having the exact configuration of test aperture opening 138''. Rather, small strips of the narrowed and lengthened rectangular screen printed area corresponding to opening 138'' would be left uncovered on either side of the shortened rectangular screen printed area corresponding to aperture opening 138'.

If it were first determined that the position of rectangular screen printed areas corresponding to aperture 138'' was correct, the position of shortened rectangular information areas corresponding to aperture 138' could then be observed by determining whether the uncovered strips on either side of the information areas were uniform. As will be subsequently explained, this is the manner in which rectangular test areas 10' are used in the present process. A plastic sheet is first screen printed to define test spaces 10' thereon which are precisely located in correct position on the sheet. Following this, information spaces 10 (see FIG. 2) are then screen printed on top of the test spaces 10'. By comparing the location of the over-printed information spaces 10 with the uncovered portions of the test spaces 10', it can then be precisely determined whether the information spaces are correctly positioned on the plastic sheet.

Referring again to FIG. 15, the test columns 14' correspond in location to the columns 14 used to designate the position of the credit card on a plastic sheet while test columns 16' correspond to the columns 16 used to designate the sheet number. The test columns 18' correspond in location to the columns 18 used to designate the run number while test areas 12' correspond in their location to the information spaces 12 which may be used to designate a clock track. Test spaces 20' correspond in location to information spaces 20 used to designate the numerical information 0 or 1 while the test spaces 22' correspond to information spaces 22 used to designate the numbers 0 or 2. Test spaces 24' correspond in location to the information spaces 24 used to designate the numbers 0 or 4 and the test spaces 26' correspond in their location to the information spaces 26 used to designate the numbers 0 or 8.

As illustrated, the crosshair test pattern 141 is composed of four blocks or exposed areas 147 which are separated from each other to leave a horizontal opening 149 and a vertical opening 150. As will be described, the location of the blocks 147 corresponds to the location of the crosshairs 36 as discussed in regard to FIGS. 3 and 4. The crosshairs 36 are printed on the front surface 29 of a plastic sheet 28 with credit card areas 30 and offset printing 32 thereon (FIG. 3). It is important that coded information which is screen printed on the back of the plastic sheet 28 be properly aligned with the offset printing on its front surface. To check this alignment, light may be passed through the plastic sheet 28 so that the location of the crosshairs 36 becomes visible on the back surface of the sheet. When the back surface of the sheet is screen printed to delineate test spaces 10' and the crosshair test pattern 141, correct alignment is indicated if the crosshairs 36 are aligned with the horizontal and vertical openings 149 and 150 between the crosshair blocks 147.

Figure 16:
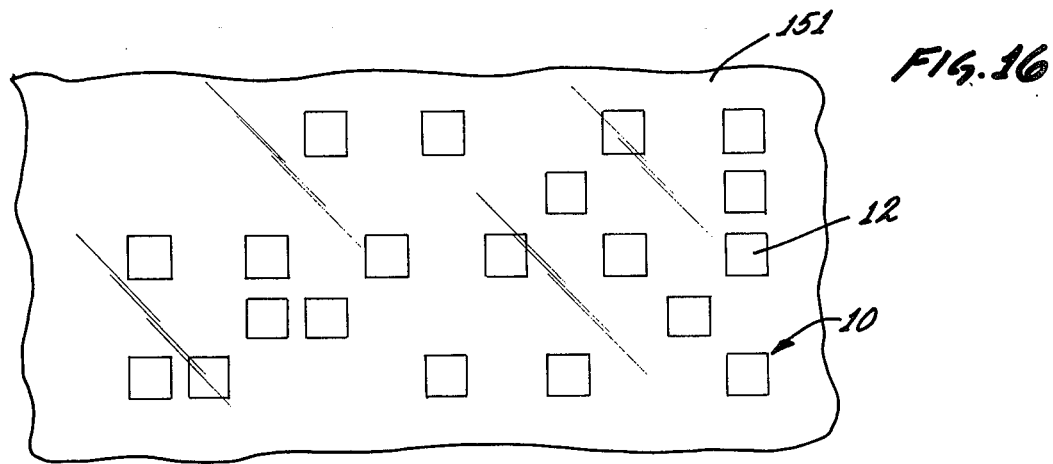
FIG. 16 is a plan view of an information area on an information film with information spaces positioned within the information area.

By way of comparison, FIG. 16 illustrates an information film portion 151 having exposed shortened rectangular information spaces 10 and exposed clock track spaces 12 thereon. By comparing the exposed spaces on information film portion 151 with the exposed spaces on test film portion 145 shown in FIG. 15, it will be observed that the exposed information spaces 10 correspond in their location to exposed test spaces 10'.

Thus, if the film portion 151 were placed in overlying relation to test film portion 145, each of the exposed information spaces 10 would partially cover an exposed test space 10'. If the test spaces 10' were properly aligned, it could then be determined whether information spaces 10 were properly aligned by comparing their position with the position of test spaces 10'.

The use of photographic film (described with regard to FIGS. 5–16) in exposing information spaces 10 or test spaces 10' is done as a preliminary step in forming silk screens which are used to screen print test spaces or information spaces on the back surface of a plastic sheet. After exposing selected spaces on a photographic film, the film is then developed in a conventional manner. The developed film is clear except for the selected spaces thereon which have been exposed and the developed film is then used to form a silk screen having openings therein which correspond in location to the exposed spaces on the film.

FIG. 17 illustrates the first step in forming a silk screen having openings therein which correspond to exposed spaces on a sheet of photographic film. A flat table 152 may be used in preparation of a silk screen designated 155. The silk screen 155 includes a rectangular frame 156 having a fine mesh screen 154 stretched between the members of the frame. A sheet of plastic 158 is placed against the flat table 152 and silk screen 155 is then placed over the sheet of plastic with the fine mesh screen 154 engaging the plastic sheet. Following this, a light-sensitive emulsion 160 is applied to the fine mesh screen 154 by a squeegee 162 having a squeegee arm 164. The emulsion 160 is, thereby, forced into the interstices between the wires of the fine mesh screen 154 such that the screen is completely coated by the emulsion.

As a preparatory step to the coating of the silk screen 155 with a light-sensitive emulsion, the screen is preferably aged. In aging the screen, the screen is placed in a silk screen press, as will be described, and a water soluble oil is squeegeed through the apertures in the screen for an extended period such as two hours. During aging, the screen is subjected to the same conditions that are encountered in a screen printing run. Thus, any stretching or creeping of the mesh which may occur will happen during the aging process. There will then be only minimal stretching of the screen during a subsequent printing run and, thus, less distortion of the image on the screen. After aging of the screen, any oil on the screen may be removed by water washing with the screen then being dried before coating of the screen with a light-sensitive emulsion.

After coating of the silk screen 155 with a light-sensitive emulsion 160, the silk screen is dried and inverted with the fine mesh screen 154 being positioned upwardly as shown in FIG. 18. A sheet of previously exposed film 50 is then placed on top of the inverted silk screen 155 in contact with the surface of the emulsion coated fine mesh screen 154. In placing the developed film sheet 50 against silk screen 155, the previously described locator holes 66 and 68 are precisely positioned with respect to locator brackets 166 and 168 attached to the screen frame 156. Cylindrical pins are then exerted through the locator holes 66 and 68 into precisely positioned apertures within locator brackets 166 and 168. This fixes the location of the circular locator opening 66 and the diagonal 53 with respect to the silk screen 155, thereby providing the same relationship between the film sheet 50 and the silk screen which existed between the film sheet and the exposure table 44 (see FIG. 5) on which the film was exposed.

FIG. 19, which is a sectional view taken along the line 19—19 of FIG. 18, illustrates tensioning of the fine mesh screen 154 relative to the screen frame 156 and also illustrates the use of locator bracket 168 in providing alignment of the film sheet 50 with the silk screen 155. As indicated, the fine mesh screen 154 is tensioned relative to the screen frame 156 in a conventional manner by use of a screw threaded screen tensioning mechanism denoted generally as 176. This type of tensioning mechanism is well known an thus will not be discussed in detail.

The locator bracket 168 is fixed in a precise location on the side of the silk screen frame 156 in any conventional manner, such as by welding, etc. The surface 169 of locator bracket 168 is positioned below the level of the fine mesh screen 154. A spacer member 170 is then placed over the bracket 168 with corresponding circular apertures in the bracket and spacer member being in alignment. After this, the film sheet 50 is drawn tightly over the upper surface of the spacer member 170 and a cylindrical pin 172 is placed through the oval locator opening 68 in the film. The pin 172 is held through contact with the surface of the circular aperture extending through spacer member 170 and locator bracket 168 and the upper surface of the pin is approximately flush with the outer surface of the film 50 when the pin is inserted in the aperture. To ensure that the film 50 remains held by the pin 172, a small piece of adhesive coated tape 174 may be placed over the exposed end of the pin 172 and in contact with the areas of film surrounding the oval locating opening 68.

As stated previously, the light-sensitive emulsion 160 is squeegeed into the interstices of the fine mesh screen 154 and the film sheet 50 is drawn tightly against the screen. FIG. 19a is an enlarged sectional detail view illustrating the relationship of the film sheet 50 to the fine mesh screen 154 and the light-sensitive emulsion 160 retained therein.

As described previously, the film sheet 50 may be subject to some minor degree of stretching due to temperature changes, etc. Through use of a circular locator opening 66 and an oval locator opening 58 in the film sheet, any stretching of the film occurs along the diagonal 53 which passes through openings 66 and 68. By restricting any stretching of the film to the diagonal 53, the degree of distortion is minimized while permitting the film to lay in a flat condition against the inverted silk screen 155.

The function of the locator bracket 166 is not described in detail since its structure and function is the same as that described for locator bracket 168, spacer 170, etc. The circular locator opening 66 is fixed by the bracket 166 and, thus, the cylindrical pin inserted in the bracket engages the surface of the opening 66. Any stretching of the film sheet 50, therefore, occurs at the connection between oval locator opening 68 and locator bracket 168.

Figure 20:
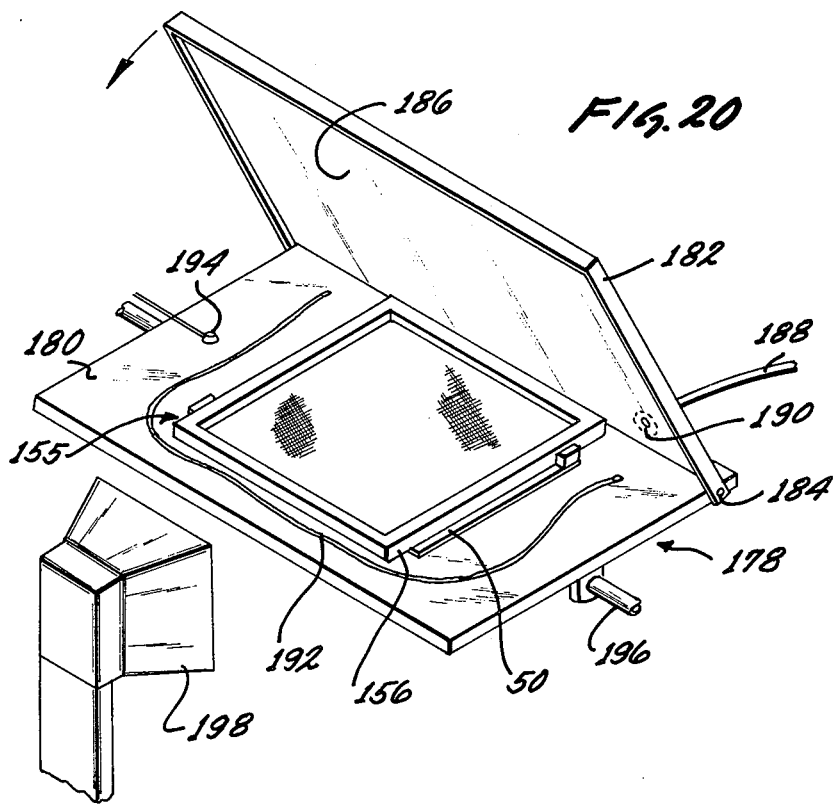
FIG. 20 is a perspective view of a silk screen with its bottom side downward against a transparent table with a frame rotatably positioned above the table and supporting a flexible member used in securing the silk screen to the table.
Figure 21:
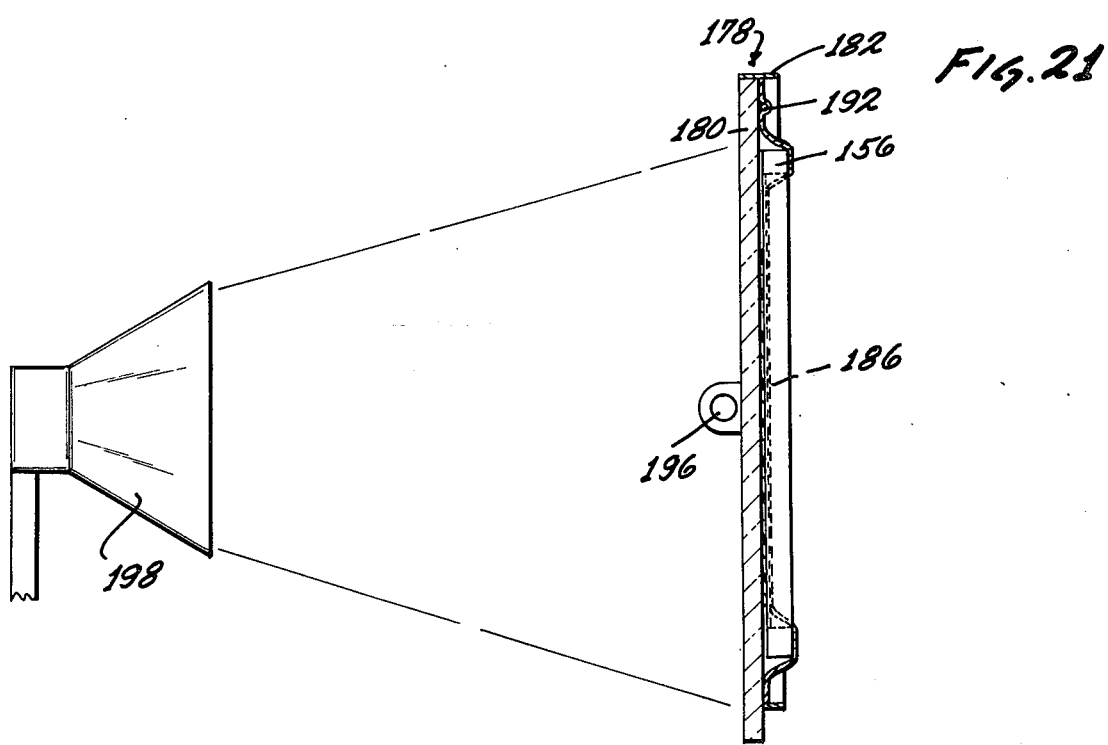
FIG. 21 is an elevation, partially in section, of the illumination of an emulsion-coated silk screen supported in a vertical position to expose the surface of the screen to light except at locations covered by darkened spaces on a photographic film in contact with the screen.

After coating the silk screen 155 with a light-sensitive emulsion 160 and precisely attaching a sheet of exposed film 50 to the inverted silk screen, the silk screen is ready for exposure of the light-sensitive emulsion. In exposing the light-sensitive emulsion on the silk screen 155, as shown in FIGS. 20 and 21, the silk screen is first placed on a vacuum table 178 with the film sheet 50 in contact with a flat transparent table member 180. A frame 182 is pivoted to the table member 180 at pivot points 184 and a flexible sheet 186, formed of rubber or similar material, is stretched across the frame. The flexible sheet 186 includes a vacuum inlet 190 passing through the flexible sheet and leading to a vacuum line 188. In drawing a vacuum, a rope 192 or similarly shaped object is laid on the table member 180 about silk screen 155 with the end of the rope positioned closely adjacent to vacuum inlet 190. A light sensor 194 is also positioned on table member 180 with the sensor indicating the degree of exposure of the light-sensitive emulsion on silk screen 155 from light passing through transparent table member 180.

The vacuum table 178 is pivotally mounted on a shaft 196 for rotation of the table and the silk screen 155 into a vertical position. Before rotation of the table 178 to a vertical position, the frame 182 is pivoted downwardly into contact with table member 180 and a vacuum is drawn through the line 188 to draw the flexible sheet 186 into tight contact with the table member 180 and silk screen 155. The vacuum table 178 is then pivoted into a vertical position about support shaft 196 and the screen 155 is illuminated by a light source 198.

The illumination of the silk screen 155 is illustrated in FIG. 21 with the silk screen positioned vertically by rotation of the vacuum table 178. The extent of illumination of the silk screen 155 from light source 198 is controlled by the sensor 194, as previously described. Thus, when the illumination of the screen reaches a certain predetermined level, the light source 198 is then turned off.

It is preferable to have the silk screen 155 in a vertical position during illumination by the light source 198 since this reduces distortion of the screen during its illumination. Any stretching which may occur in the fine mesh screen 154 or sagging of the table member 180 is reduced when the screen and table member are placed in a vertical position. If the silk screen 155 and table 180 were in a horizontal position during illumination, stretching of the fine mesh screen 154 would not be uniform since there would be more tendency for the screen and table member to sag at their mid-portions. Thus, more inaccuracy would result in the location of the image formed on the silk screen 155.

During exposure of the light-sensitive emulsion 160 on silk screen 155, the surface of the fine mesh screen 154 is exposed to light except at those locations where the light is blocked by the previously exposed areas on the film sheet 50. On exposure of the light-sensitive emulsion 160 to light, it becomes set and is thereafter water insoluble. However, those areas on the fine mesh screen 154 which are not exposed to light remain water soluble. Thus, after exposure of the silk screen 155 to light, the silk screen is washed in a conventional manner. The washing removes the unexposed portions of the light-sensitive emulsion which were covered by the exposed portions of the film sheet 50. The silk screen then has a moisture impervious coating except at the areas which were protected from light.

An exposed silk screen 155, illustrated in FIG. 22, has an exposed screen surface 200 which is impervious to water or ink except within areas 202 on the screen surface which were not exposed to light. The areas 202 correspond to exposed areas on the film which covered the surface of the screen during its illumination. The only portions of the screen surface 200 which will transmit ink are, therefore, within the areas 202 which contain small precisely spaced openings in the screen surface.

As indicated, the number of areas 202 correspond in number and location with the number and location of separate credit cards, such as 100, to be formed from a plastic sheet in the performance of the present process. To ensure that the openings in the exposed screen surface 200 are properly placed, the film sheet 50 used in exposing the screen surface may be placed in overlying relation to the exposed screen surface. The small openings in the screen surface may then be checked to determine whether they are precisely aligned with the exposed darkened areas on the film sheet 50.

After preparation of a silk screen having openings therein corresponding to the test pattern described with regard to FIGS. 14 and 15, the screen may then be used to screen print the back surface of a plastic sheet 28 as shown in FIG. 3. The plastic sheet 28 has crosshairs 36 and a plurality of credit card spaces 30 defined on its front surface 29. After screen printing the test pattern on the back surface of the plastic sheet 28, the plastic sheet may be checked by placing its front surface 29 downwardly against a check table 204 as shown in FIG. 23.

The check table 204 includes corner check lights 206 positioned flush with the surface of the table and guide bars 207 and 209 which contact the guide and gripper edges of sheet 28. The locations of the corner check lights 206 correspond with the locations of the centers of the crosshair patterns 36 on the front surface of the plastic sheet. Additionally, the illumination table 204 may include a center check light 208 which is also positioned flush with the surface of the table. When the corner check lights 206 are turned on, the positioning of the screen printed test spaces on the back of the sheet 28 may then be checked in the manner illustrated in FIG. 24. A crosshair test pattern 141 composed of blocks 147 having a horizontal opening 149 between the blocks and a vertical opening 150 is screen printed on the back surface of the plastic sheet 28 at its corners. If the test pattern has been correctly printed on the back surface of the plastic sheet 28, the lines of the crosshair pattern 36 at each of the four corners of the sheet are centered between the horizontal and vertical openings 149 and 150 in the crosshair test patterns 141 and the illumination from light 206 appears as a pinpoint of light at the center of the intersection of the horizontal and vertical openings.

The position of the crosshair test patterns 141 bears a precise relation to the location of the test spaces 10' which are screen printed on the back of the sheet 28. Thus, the alignment of the crosshair test patterns 141 with the crosshairs 36 indicates that the test spaces 10' are correctly positioned on the back of the sheet 28 and in proper alignment with the credit card areas 30 and offset printing 32 on the front surface of the sheet.

After screen printing a test pattern on the back of the sheet 28, the back surface of the sheet is then silk screened again to overprint a plurality of information spaces 10 on the back surface of the sheet. To observe the overprinted portions of the sheet 28 more readily, the test pattern printed on the sheet may be printed in one color, such as red, while the overprinted information spaces 10 is done in another color, such as black. The overprinted plastic sheet 28 is then again placed on the check table 204. As described previously, the test spaces 10' have an elongated rectangular configuration while the information spaces 10 have a shorter and wider rectangular configuration.

The overprinting of the information spaces 10 with regard to the test spaces 10' may be observed by use of the center check light 208. The light 208 shines through the overprinted plastic sheet 28 to reveal the relationship of the information spaces 10 and test spaces 10' as illustrated in FIG. 25. As shown, the shortened rectangular information spaces 10 do not completely cover the lengthened rectangular test spaces 10'. After overprinting, narrow bands 211 on the test spaces 10' are still visible since they have not been overprinted by the information spaces 10. If the bands 211 are of equal width and are equally spaced between the sides 213 of the information spaces 10, this indicates that the information spaces 10 are correctly positioned on the back surface of sheet 28.

The reason for overprinting the plastic sheet 28 is to determine whether the silk screen 155 which prints the information spaces 10 is correctly positioned in a silk screen press. Once it has been determined that the silk screen 155 is correctly positioned in the press, the silk screen may then be used to print a number of plastic sheets 28 with identical printing on their back surfaces.

In preparing coded credit cards according to the present process, all of the information spaces 10 to be printed on the back surface of a completed plastic sheet are preferably not placed on the sheet with a single silk screen printing. It is more efficient to print the coded information spaces 10 on the back surfaces of the plastic sheets through use of a number of separate silk screen printings. For example, with reference to FIGS. 2–4, the first silk screen printing of each of the plastic sheets 28 in a given run may be used to designate each of 100 screen printed areas 4 on the sheets with numbers ranging from 00 to 99 in the columns 14. After the first screen printing, each of the screen printed areas 4 on each sheet 28 would, thus, have a different number. In addition to printing a numerical designation of position on each screen printed area 4, the numerical information designating the run number may also be placed on each of the sheets 28 in the first screen printing. Assuming the run number to be 3, this could be designated on each sheet 28 by screen printing the spaces 20 and 22 in the right-hand column of the columns 18 with the other columns 18 being unprinted (FIG. 2).

After screen printing position numbers for the individual areas 4 and also a run number on each of the sheets 28, the individual sheets in the run may then be identified by the screen printing of information spaces 10 in the columns designated 16. Assuming a run of 10,000 sheets, information spaces 10 in columns 16 would then be printed to designate each sheet 28 with a number ranging from 0000 to 9999. The screen printing of sheet numbers in the information areas 4 would generally be done with a plurality of screen printings.

Since four digits would be used in expressing separate sheet numbers in a run of 10,000 sheets, the last digits in the sheet numbers could be screen printed on the sheets 28, then the second to the last digit, etc., with a plurality of silk screen printings. A sheet having a number 2997, for example, could be screen printed in one printing to indicate the number 7 in the right-hand column of the columns 16 with the next screen printing designating the number 9 in the first column from the right, the next silk screen printing designating 9 in the second column from the right and the last silk screen printing designating 2 in the left-hand column of columns 16.

When numerical information is screen printed on the back of the plastic sheets 28 in a plurality of separate silk screenings, it is necessary that the silk screen used in each screening be very precisely placed in the silk screen press. This is required in order that each printing is correctly aligned with previous printing on the sheet and subsequent printing on the sheet. To ensure that the screen is properly positioned in the silk screen press, one or more test sheets are preferably overprinted each time a new silk screen is placed in the screening press. The overprinted sheets are then examined on the check table 204 as described in regard to FIGS. 23–25.

By comparing the overprinting of the information spaces 10 with test spaces 10', the placement of the silk screen in the press can be controlled very precisely. For example, if overprinting indicates that the information spaces 10 are out of alignment with the test spaces 10', an appropriate adjustment may be made to the position of the silk screen 155 in the press. A second overprinted sheet may then be run and checked, etc., until the alignment of the silk screen in the press provides the precisely desired position of information spaces 10 on the overprinted sheet. At this point, the position of the silk screen 155 in the press will be determined to be correct and the silk screen may then be used to print a number of plastic sheets.

FIG. 26 illustrates the manner in which a plurality of plastic sheets are screen printed in a silk screen press designated 212. A stack of plastic sheets 214 is positioned at one end of the press 212 with the stack being progressively raised as a sheet is removed from the top of the stack. The stack of plastic sheets 214 is supported on a conventional stack-raising mechanism 216 which functions to move the stack upwardly. The upward movement of the stack 214 as sheets are removed or the downward movement of the stack when sheets are added is indicated by the arrows designated 218.

Sheets of plastic are removed from the top of the stack 214 by a pick-up mechanism 220 of standard construction. The sheets are then moved in the direction of the arrow B and placed on a belt conveyor 222 positioned on a feed table 224. The belt conveyor 222 and feed table 224 are of conventional construction with the belt conveyor undergoing intermittent movement which is timed with the operation of the press 212. Thus, as one sheet is screen printed within the press 212, another sheet is moved to the press on the belt conveyor 222. If the press 212 is not ready to receive the new sheet on the belt conveyor 222, the movement of the conveyor automatically stops until the press is ready for the new sheet.

As a plastic sheet is conveyed on belt conveyor 222, it moves beneath a series of sheet guide bars 226 positioned above the sheet and parallel to its direction of travel. The sheet guide bars 226 ensure that the sheet is positioned flat against the belt conveyor 222 and spherical rollers may be attached to the bottom of the guide bars for rolling contact with the sheet. The sheet guide bars 226 are supported by cross bars 228 and 230 which are part of a rectangular frame (not shown) that is positioned above the feed table 224.

In its movement on the belt conveyor 222, a sheet passes beneath an anti-static bar 232 of standard construction which serves to remove static electricity from the sheet. Also, as the sheet moves on the belt conveyor 222, it passes beneath a thickness indicator generally indicated as 234. As will be described, the thickness indicator 234 senses the thickness of the sheet. Thus, in the event that several thicknesses of sheets are being conveyed on belt conveyor 222, the thickness indicator 234 will sense this condition and will automatically shut off the press 212 and belt conveyor 222 to avoid jamming the press.

After being transported on belt conveyor 222, the sheet then moves on to a second belt conveyor 236 positioned adjacent the press 212. The press 212 is positioned on a support 238 and includes pivotally mounted side members 240 which undergo pivotal movement in the direction of the arrows indicated as 242. A silk screen 155 is supported within the press by connection of the locator brackets 166 and 168, described previously, to the pivotal side members 240. When a new sheet is pulled into the press, the side members 240 are rotated upwardly, as indicated, and the silk screen 155 is also rotated upwardly. Then, after the sheet is pulled into the press, the side members 240 are rotated downwardly and ink is applied to the plastic sheet through the openings in the silk screen 155 while the sheet is fixedly held beneath the silk screen.

The silk screen press 212 is generally of a standard construction except for certain modifications designed to increase the accuracy of the press. For example, the screen press 212 may be a Hartfeldt International Screen Press as sold by American Screen Process Equipment Company, 404 North Noble Street, Chicago, Illinois. Since the silk screen press 212 is of a substantially standard construction, it will not be described in great detail. However, the modifications to the press, which are not standard construction, will be described in detail.

As described previously with regard to FIGS. 3 and 4, the gripper edge 38 and the guide edge 40 are the reference surfaces which are used to control the movement of a plastic sheet into a silk screen press, such as press 212. As the sheet is moved face downwardly on the belt conveyor 236, the gripper edge 38 moves against gripper edge stops 250 which are adjustably positioned adjacent the opening to the press by gripper edge stop bars 244. Also, the edge of the sheet opposite its guide edge is encountered by a guide pusher 248 which moves the sheet sideways to bring the guide edge 40 into abutment with a guide edge stop 246. After contact of the sheet with the gripper edge stops 250 and the guide edge stop 246, the sheet is then properly positioned for movement into the press 212 on upward rotation of the side members 240 and silk screen 155.

With the side members 240 rotated upwardly, the gripper edge of the sheet is gripped by a plurality of gripper fingers 252 connected to a standard chain drive mechanism 254 and the sheet is then pulled into the press 212 by the gripper fingers on actuation of the chain drive mechanism. Several sets of gripper fingers 252 are supported on the chain drive mechanism 254 with one set of grippers being used, for example, to draw a sheet into the press 212 and to hold the sheet in the press during the screen printing operation while another set of gripper fingers 252 is moved adjacent the opening to the press to grip the next sheet, etc. A vacuum bed of standard construction (not shown) is positioned within the press 212 and situated below the silk screen 155. Thus, after the plastic sheet is drawn into the press 212 by the gripper fingers, the sheet is firmly supported by the vacuum bed positioned below the silk screen during the silk screen printing of the sheet.

After the screen printing operation is completed, the press 212 is opened by upward rotation of the side members 240 and the sheet within the press is moved forwardly out of the press onto a further conveyor belt (not shown) which transports the sheet through a drying tunnel 264 while a new sheet is pulled into the press by a further set of gripper fingers 252 positioned at the opening to the press, etc.

With the press 212 in a closed position, as shown in FIG. 26, the plastic sheet within the press is held on the bed beneath the silk screen 155 and ink is forced through the openings in the screen through movement of a squeegee applicator 256. The movement of the squeegee applicator 256 is indicated generally by the arrows designated 258 with the applicator first moving across the screen in one direction and then reversing its movement to move across the screen in the other direction. For increased accuracy in printing, it is desired that the movement of the squeegee applicator 256 be relatively uniform. This is accomplished by a pair of squeegee stabilizers 260, as will be described, which are positioned at either end of the squeegee applicator 256. In controlling the closing of the gripper fingers 252 to grip a plastic sheet at its leading or gripper edge, a gripper actuator 262 of standard construction having a throw arm 265 is brought into contact with a cam 267 which is rotated to provide closing of the gripper fingers.

As stated, the locator brackets 166 and 168, as shown in FIG. 26, are used to connect the silk screen 155 to the press 212. By utilizing the locator brackets 166 and 168 in this manner, the accuracy provided by the locating holes 66 and 68 formed in the film 50 prior to its exposure (see FIG. 5) and used as a reference basis during imaging of the silk screen 155 (see FIG. 18) is carried forward as the reference basis in locating the silk screen 155 on the press 212. By using this same reference basis throughout the entire process, the overall accuracy of the process is greatly improved. In the carrying forward of this reference basis for placement of the silk screen 155 within press 212, plates 243, as shown in FIG. 26a, are connected to each of the side members 240 by any convenient means such as by bolts 245. Affixed to the upper surface of the plates 243 are blocks 255 with each block having a cylindrical pin 247 secured to its upper surface. The pins 247 are precisely arranged to engage the apertures in the locating blocks 166 and 168 which were used in positioning of the film sheet 50 against the silk screen 155 during its formation (FIG. 18).

Also secured to the plates 243 are upright members 249 having clamp arms 251 secured to their upper surfaces through any convenient means such as a bolt 257. The clamp arms 251 each support a screw clamp 253 in threadable engagement therewith with the screw clamps including a foot member 259 that bears against the upper surface of the silk screen frame 156. The silk screen 155 is, thus, held in fixed engagement with the precisely positioned pins 247 which precisely position the silk screen with respect to the press 212.

The thickness indicator 234 is illustrated in detail in FIG. 27 which is taken along the line 27—27 of FIG. 26. The thickness indicator 234 includes an L-shaped body portion 266 which is affixed to the table 224 in any convenient manner such as by a bolt 268. The body portion 266 defines a recess 270 and a light source 272 is supported by the body portion within the recess at a spaced distance above the table 224. A light sensor 274 is positioned in the table 224 with its surface flush with the table. On movement of a plastic sheet 276 beneath the light source 272, light from the light source is transmitted through the sheet and is received by the light sensor 274. In the event that there is more than one sheet beneath the light source 272, the amount of light received by the sensor 274 will be diminished. When this condition is noted by the sensor 274, the press 212 and the belt conveyor 222 are automatically shut down to avoid jamming of the press.

FIG. 28 is a plan view illustrating the opening to press 212 and the controlled positioning of the gripper edge stops 250 and the guide edge stop 246 to assure that the plastic sheet is properly positioned within the silk screening press. As indicated, a cross member 278 is positioned between the side members 240. A T-shaped bracket 280 is connected to the front surface of cross member 278 at its midpoint and each of the stop bars 244 are pivotally connected at their inner ends to the bracket through pivotal connections 281. The outer end of each stop bar 244 is held by a generally U-shaped supported bracket 284 having a micrometer 282 mounted on its outer leg and a spring 286 positioned between its inner leg and the inner surface of the stop bar. Each of the micrometers 282 includes a barrel 288 which bears against the outer surface of the stop bar 244. The support brackets 284 are each connected to one of the side rails 240 by any suitable means, such as welding, and the position of each stop bar 244 may, therefore, be altered by movement of the outer end of the stop bar through adjustment of the micrometer 282. On movement of the stop bars 244, the gripper edge stops 250 may be moved relative to the press opening to change the position of the plastic sheet relative to the press when it encounters the gripper stops.

In addition to micrometer adjustment of the gripper stops 250, the position of the guide edge stop 246 is also adjustable by a micrometer 290. Thus, the position of the guide edge of the plastic sheet may also be very precisely controlled in positioning the plastic sheet relative to the silk screening pres.

FIG. 29, which is a sectional view taken along line 29—29 of FIG. 28, illustrates the structure of the gripper edge stops 250 and the manner in which they are positioned relative to the gripper fingers 252. The gripper edge stops 250 each include a pivot support block 292 that is connected to the gripper stop bars 244 through any convenient means such as a nut and bolt arrangement 294. A pivot pin 296 having an enlarged head which bears on the upper surface of the block 292 extends vertically downward through the block and engages a rotatable stop block 298. The upper surface of the stop block 298 slidably engages the lower surface of the support block 292.

The stop block 298 includes a vertical leading surface 300 which is joined to a downwardly inclined surface 302 that leads to a vertical abutment surface 304. In operation, a plastic sheet moved from conveyor 236 against the rotatable stop block 298 may first encounter the downwardly directed surface 302 which directs the gripper edge of the plastic sheet against the vertical abutment surface 304. As described in regard to FIG. 28, the stop bars 244 are adjustable by inward or outward movement of the ends of the bars. This adjustment varies the angular position of the stop bars 244 with respect to the direction of movement of the plastic sheet as it is directed against the stop blocks 298. However, since stop blocks 298 are free to rotate, the vertical abutment surfaces 304 of the stop blocks are free to assume the position of the gripper edge of the sheet.

After contact of the gripper edge of the plastic sheet with the vertical abutment surfaces 304, the gripper edge is firmly grasped by the gripper fingers 252 and the sheet is then pulled into the open press. Each of the gripper fingers 252 is supported adjacent its rear end by a gripper support block 306. The gripper fingers 252 are bent downwardly so that they function in the manner of springs to grasp the gripper edge of the plastic sheet. The gripper support block 306 includes a roughened upper surface 308 positioned beneath the gripper fingers 252. Thus, when the gripper fingers 252 are free to move downwardly, the gripper edge of the plastic sheet is fixedly held between the roughened surface 308 and the ends of the gripper fingers.

A cam 267, referred to in FIG. 26, is shown in phantom line drawing in FIG. 29. The cam 267 is connected to a rotatable shaft 312 having a cam surface 314 as part of the outer surface of the shaft. When cam 267 is struck and moved in a counterclockwise direction by throw arm 265 (FIG. 26), this causes rotation of the shaft 312 in a counterclockwise direction which moves the cam surface 314 out of contact with the undersurfaces of the gripper fingers 252. The gripper fingers 252 are then permitted to spring downwardly against the plastic sheet.

FIG. 30 is an enlarged detail view of the guide edge stop 246 taken along the line 30—30 of FIG. 28. The guide edge stop 246 includes a support block 316 positioned on a support slide 320. The block 316 is engaged with the slide 320 through a tongue and groove connection 322 and is anchored to the slide by a screw 324 which threadedly engages the block 316 with the end of the screw in forcible contact with the bottom of the groove formed within the slide. A stop member 318 is adjustably supported through contact with the block 316 and has a downwardly depending leg 319 whose lower end 330 extends into a groove 326. The extension of the lower end 330 into the groove 326 prevents wedging of the guide edge of the plastic sheet beneath the lower end surface 330.

Turning to FIG. 31, which is a sectional view taken along line 31—31 of FIG. 28, a hold down screw 332 having an enlarged turning knob at its upper end bears against a spring 334 which slidably engages the upper surface of the stop member 318. The action of the spring 334 holds the lower surface 338 of the stop member 318 in contact with the upper surface 336 of the support block 316. Both the screw 324 and screw 332 are threadedly engaged with the support block 316 with apertures 340 and 342 in the stop member 318 surrounding the screws. The apertures 340 and 342 permit movement of the stop member 318 relative to the support block 316 and screws 324 and 332 within the limits permitted by the apertures.

A micrometer support member 344, which is attached to the support block 316 through any convenient means, such as welding, supports the micrometer 290. The micrometer 390 includes a micrometer barrel 346 which is movable on rotation of the micrometer 290 to impart movement of the stop member 318 with respect to support block 316. The stop member 318 also includes a spring support plate 348 which is positioned in front of support block 316. A spring adjustment screw 352 passes through an aperture in support plate 348 and is threadedly engaged with the support block 316. A spring 350 is positioned between the enlarged head of the spring adjustment screw 352 and the outer surface of the support plate 348. The compressive force exerted by the spring 350 against the outer surface of support plate 348 may be varied by threading the adjustment screw 352 into or out of the support block 316 to provide variation in the resistance of the spring to movement of the stop member 318.

The stop member 318, as described, functions to contact the guide edge of the plastic sheet after the sheet has been pushed into contact with the stop member by a guide pusher 248 as shown in FIG. 28. Turning to FIG. 32, which is taken along line 32—32 of FIG. 28, a support block 354 engaged with the groove 326 that slidably supports guide pusher 248, is held fixedly within the groove by a screw 356. The screw 356 is in threaded engagement with the support block 354 and has an end 358 in contact with the bottom surface of the groove 326.

Movement of the guide pusher 248 is provided by a drive means 362 that is drivingly connected to a movable slide member 363 which contains the groove 326. The drive means 362, which may be a piston and cylinder, actuates a rod 365 that is connected through a brace 367 to slide member 363. Movement of the rod 365, thus, produces a corresponding movement, indicated by the arrows B, of the slide member 363. The drive means 362 is held stationary by connection, in any suitable manner, to a stationary member 369.

Movement of the slide member 363 produces movement of the block 354 which is connected thereto through the groove 326. A rod 364 passes through an aperture 371 in the block 354 and the rod is biased to the right from its position as shown in FIG. 32 by a biasing spring 366 which surrounds the rod and bears against an enlargement 373 secured to the rod. The outer end of rod 364 is connected to the guide pusher 248 such that movement of the block 354 and slide member 363 produces a corresponding movement of the guide pusher.

The spring 366 exerts a yieldable force against the rod 364 and also against the guide pusher 248. Thus, when the guide pusher 248 encounters a force which is greater than that applied by spring 366, relative movement may occur between the block 354 and guide pusher as indicated by the arrows C. The guide pusher 248 includes an inclined surface 368 which may first contact the edge of the plastic sheet. The inclined surface 368 leads to a vertical abutment surface 370 which supplies a pushing force against the edge of the plastic sheet to move it laterally into contact with the outer surface of the downwardly depending leg 319 on stop member 318. When the guide edge of the plastic sheet encounters the leg 319, any continued movement of the slide member 363 and block 354 produces compression of the spring 366 with the guide pusher 248 remaining stationary. The yieldable force exerted by spring 366 is, thus, overcome which prevents bowing of the plastic sheet through the force exerted by the guide pusher 248 and also prevents damage to the guide edge stop 246 from the force applied through the guide edge of the plastic sheet.

As described generally in FIG. 26, ink is forced through openings in the silk screen 155 by action of a squeegee applicator 256. To provide a very accurate screen printing operation, it is desirable that the squeegee applicator 256 make a uniform pressure contact with the silk screen 155. FIG. 33 illustrates the special construction of the squeegee applicator 256 which makes the applicator stiff so that it will not bow in the middle and will also apply a uniform force to the silk screen 155. The squeegee applicator 256 includes a squeegee blade 372 that may be made of a flexible material such as a hard rubber and which makes contact with the silk screen 155. The squeegee blade 372 is held within a blade holder 374 that is connected to a support member 376 which extends laterally across the silk screen 155.

A stiffener member 378 is connected to the support member 376 with the stiffener member increasing in thickness toward its center portion to provide greater stiffness at the center of the support member where bowing is most likely to occur. Spring blocks 380 are secured to the stiffener member 378 in any convenient manner, such as by bolts, while pins 384 secured to the blade holder 374 project vertically through the support member 376 and the spring blocks 380. Springs 382 are positioned about each of the pins 384 with the springs secured in place by nuts, or a similar means, which threadedly engage the ends of the pins to compress the springs against the upper surfaces of the spring blocks 380.

U-connectors 386 secured to each end of stiffener member 378 are connected to slide channels 390 in a manner to be described with the channels each being secured to downwardly extending drive members 388. The drive members 388 are rockably secured to a standard drive mechanism (not shown) as employed for a squeegee applicator in a silk screen press. Thus, the drive members 388 are moved first in one direction and then in another so as to move the squeegee applicator 256 back and forth with respect to the silk screen 155 as indicated by the arrows 258. During movement of the squeegee applicator 256, the drive members 388 and applicator 256 are permitted to tilt due to the standard rockable connection of the drive members to the standard drive mechanism.

FIG. 34, which is a sectional view through a squeegee stabilizer 260 along the line 34—34 of FIG. 33, illustrates the internal structure of the squeegee stabilizers that provide uniform force of the squeegee blade 372 against the silk screen 155. The squeegee stiffener member 378, as described, is connected at each of its ends to a U-connector 386 by any suitable means such as welding. Each of the U-connectors 386 is connected to a slide member 392, for example, by a pin 394 extending between the legs of the U-connector. Each slide member 392 is slidably positioned within one of the slide channels 390 and cylinders 396 are secured to the upper ends of each of the channels through flange connections 398. A rod 400 extends upwardly from each of the slide members 392 with the rod positioned within cylinder 396. The lower end of each rod 400 is threadedly engaged with a blind hole in the slide member 392.

The rod 400 includes a spacer 402 in pressed fitted engagement with the rod and positioned between the rod and the inner surface of cylinder 396. The outer surface of spacer 402 is slidable with respect to the inner surface of the cylinder 396. Thus, the rod 400 and spacer 402 may undergo movement as a unit with respect to the cylinder 396.

A second cylinder 404 is positioned about the outer end of rod 400 with the second cylinder having a threaded connection 406 with the cylinder 396. A sleeve 410 is positioned within the outer end of the cylinder 404 with the outer surface of the sleeve in press fitting engagement with the inner surface of the cylinder 404. A spring 408 is positioned about rod 400 between the sleeves 402 and 410. Since the sleeve 410 is fixed with respect to cylinder 404 and the sleeve 402 is fixed with respect to rod 400, the spring 408 is confined between the sleeves and exerts a downward force against the rod 400 through the sleeve 402.

A closure member 414 having a central aperture 415 is positioned about the upper end of rod 400 and bears against the upper end of the cylinder 404. The closure member 414 includes a reduced diameter inner end 417 which is slidably positioned within sleeve 410. The inner end 417 is internally threaded and is in threaded engagement with external threads 412 on the rod 400. The closure member 414 also includes a rotatable detent 416 which is pivotally secured to the closure member by a pivot 420. On rotation of the detent 416 to the position shown in FIG. 34, the detent engages a slot 418 in the outer surface of the second cylinder 404. With the detent 416 engaged with slot 418, the second cylinder 404 cannot be rotated with respect to cylinder 396. However, when detent 416 is pivoted out of engagement with slot 418, the second cylinder 404 may be rotated with respect to cylinder 396 whose position is fixed by the flange connection 398.

On rotation of the second cylinder 404 in a clockwise direction with respect to cylinder 396, the sleeve 410 which is press fitted within the second cylinder is moved inwardly with respect to the rod 400. This shortens the spring 408 which then exerts a greater compressive force against rod 400 through the sleeve 402 in press fitted engagement therewith. On rotation of the second cylinder 404 in a counterclockwise direction, the sleeve 410 is moved outwardly with respect to rod 400 which lengthens the spring 408 with the force of the spring against the rod then being reduced. In this manner the force exerted by the squeegee applicator 256 against the silk screen 155 may be varied.

After completion of the screen printing operation, coded information is indicated on the back surface of a translucent sheet of plastic material to delineate a number of information areas on the back surface with each information area corresponding to a credit card area on the front surface of the sheet. The completed sheet, designated 422 in FIG. 35, is placed in a stack with other plastic sheets. A backing sheet 424 which may also be formed of a translucent plastic material having a thickness approximately the same as that of sheet 422 is placed beneath the completed sheet 422 while transparent cover sheets 426 and 428 are placed at the top and the bottom of the stack. As indicated, the cover sheets 426 and 428 may be considerably thinner than the sheets 422 and 424. After forming a stack of sheets, the sheets in the stack may be tack-welded together at several points, such as points 430 so as to bond the sheets together to form a single structure. The single structure formed of four sheets tack-welded together is referred to by the reference numeral 431.

In the next operation, a plurality of the tack-welded single structures 431 are placed in a stack including, for example, 100 such single structures. The stacked single structures 431 are then placed in a press which may include metal separator plates between the single structures and are then heated under great pressure to laminate the sheets in each of the single structures together.

A stack of the laminated single structures 431 is denoted in FIG. 36 as 432.

The stack 432 is then subjected to a cutting operation as indicated in FIG. 37 in which a top cut 434 is removed from each of the laminated structures in the stack and a side cut 436 is also removed from each of the structures in the stack. Following this, the stack 432 is then subjected to a further cutting operation indicated in FIG. 38. In this cutting operation, a shear blade 438 may be used to make a plurality of crosscuts 440 to divide the stack into a plurality of smaller stacks 442. Each of the stacks 442 is then cut further, as illustrated in FIG. 39, as through use of a shear blade 446, to make a plurality of cuts 444. Each vertical cut 444 produces a stack of credit cards indicated 448. The individual credit cards in the stack 448 may then be subjected to a conventional trimming operation to round the corners of the cards.

As described in the foregoing description (see FIG. 2), the unique card numbers in each card area may be a composite number made up of a run number, a sheet number, and a position number of the card area on the sheet. The run number, sheet number and position number may be viewed as being expressed from left to right by the columns 18, 16 and 14. It should be borne in mind, however, that the card number need not be expressed from left to right on the card. The card number may, for example, be expressed from right to left, or sequentially outward beginning with the middle digit in the card number, etc. Also, the run number, the sheet number and the position number may be expressed from right to left or in any consistent arrangement of the digits.

Also, in the numerical system chosen for marking cards over a given range of numbers, it is not necessary that all the numbers in the range be used. For example, certain numbers may be excluded by beginning the range with a number greater than zero, or by using only the odd or even numbers in the range, etc.

The laminating and cutting operations described in FIGS. 35–39 are conventional operations. Thus, these operations have merely been described in a general manner.

I claim:
1. A process for forming a credit card sheet having coded information printed thereon for a plurality of credit cards to be formed from said sheet, said process comprising:
  placing a sheet of photographic film in contact with a flat table with an exposure head positioned relative to the table;
  forming first and second locating openings in said film when said film is in a flattened condition;
  said first opening being positioned adjacent a corner of the film;
  the second opening positioned adjacent another corner of the film and diagonally opposite from the first opening and the second opening defining an elongated slot having an axis which coincides with a diagonal axis passing through the first and second locating openings so as to permit any subsequent elongation or stretching of said film to occur along said diagonal axis;
  sequentially exposing small predetermined coded spaces on said film by actuating the exposure head to expose a small space on the film causing relative movement between the table and head and exposing a new space on the film, and repeating this operation until all of the desired coded spaces on said film are exposed;

developing the exposed film to provide darkened spaces on the film corresponding to the exposed coded spaces;

placing the developed film against a fine mesh screen positioned within a frame;

said screen having a coating thereon of a light-sensitive emulsion and means on said screen frame defining diagonally positioned alignment means whose placement corresponds to the placement of the first and second locating openings as formed in said film;

positioning the film with respect to the frame by coaction of said locating openings and said alignment means to fix the position of the first locating opening with respect to the frame and screen and to fix the position of said diagonal axis with respect to the frame and screen;

shining a light through the film to expose the emulsion on the screen except at the locations of the coded darkened spaces on the film;

removing unexposed emulsion from the screen to form a coded information screen having information apertures therein which correspond in size and location to the darkened spaces on the developed film;

placing the coded screen in a silk screen press;

said press including locating means whose placement corresponds with the placement of said alignment means;

positioning the screen on the press by coaction of said locating means and said alignment means, and passing ink through the apertures in the coded information screen onto a credit card sheet to form screen printed information spaces on said sheet which correspond to the coded spaces on the developed photographic film.

2. The process of claim 1 including:

forming said first and second locating openings when the film is held flat against said table by inserting a first and a second punch through said film into holes in the table positioned below the film;

the first punch forming the first locating opening and the second punch forming the second locating opening, and said first and second punches serving also to fix the position of the film with respect to the table when the said punches are inserted through said film and into the holes in said table.

3. The process of claim 1 wherein a plurality of said coded information screens are employed in printing a credit card sheet, including the steps of:

screen printing first encoded information spaces on a credit card sheet with a first of said plurality of coded information screens, screen printing second encoded information spaces on the credit card sheet with a second of said plurality of coded information screens third encoded information spaces with a third of said plurality of coded information screens until all of the desired information spaces have been printed with successive screen printings;

each of said coded screens having substantially identical alignment means for positioning of each screen with respect to the silk screen press, and maintaining the alignment of each coded information screen with the press through coaction of the locating means of the press and the alignment means on each of said screen.

whereby the coded areas on the credit card sheet are formed by multiple silk screen printings with accurate positioning of each screen during each screen printing through the locating means on the press and the alignment means on the information screen.

4. The process of claim 1 wherein the fine mesh screen of said information screen and the film in contact with the fine mesh screen are positioned substantially vertically during exposure of the emulsion on the screen.

5. The process of claim 1 including the step of aging said screen by subjecting the screen to conditions encountered in a screen printing run prior to coating of said screen with a light-sensitive emulsion, whereby any stretching or creeping of the fine mesh of the screen occurs prior to coating of the screen with said emulsion.

6. The process of claim 5 wherein said aging step includes:

placing the screen in a silk screen press, and operating the silk screen press to force oil through the screen.

7. The process of claim 1 including:

placing said coded screen with the developed film positioned on the screen frame against a flat light-transmitting table;

placing a flexible member over the screen and film;

forming a vacuum between the light-transmitting table and the flexible member to hold the flexible member tightly against the light-transmitting table about the coded screen, and wherein said emulsion on said screen is exposed by passing light through the light-transmitting table with the light shining through the film to expose the emulsion on the screen except at the locations of the coded darkened spaces on the film.

8. The process of claim 7 including placing a vacuum-release member about the edge of the screen frame between the light-transmitting table and the flexible member and in spaced relation with the frame;

forming a vacuum between the light-transmitting member and the flexible member by withdrawing air at a withdrawal opening in the flexible member, and said vacuum-release member being positioned closely adjacent to said withdrawal opening.

9. The process of claim 8 wherein saad vacuum-release member is a length of rope.

10. The process of claim 1 wherein the coded information spaces are rectangular.

11. The process of claim 1 wherein said credit card sheet has offset printing on its front surface which defines a plurality of credit card areas;

said screen printed information spaces are printed on the back surface of the credit card sheet, and the quantity of ink deposited on the back surface of the credit card sheet in screen printing the coded information spaces is sufficiently heavy to permit recognition of the coded spaces by passing radiant energy through the sheet and through the offset printing on the front surface of the sheet.

12. A process for forming a credit card sheet having coded information printed thereon for a plurality of credit cards to be formed from said sheet, said process comprising:

placing a sheet of photographic film in contact with a flat table with an exposure head positioned relative to the table;

forming first and second locating openings in said film when said film is in a flattened condition;

said first opening being positioned adjacent a corner of the film;

the second opening positioned adjacent a corner of the film and diagonally opposite from the first opening and the second opening defining an elongated slot having an axis which coincides with a diagonal axis passing through the first and second locating openings;

sequentially exposing small predetermined coded spaces on said film by actuating the exposure head to expose a small space on the film, then causing relative movement between the table and head in exposing a new place on the film until all of the desired coded spaces on said film are exposed;

developing the exposed film to provide darkened spaces on the film corresponding to the exposed coded spaces;

placing the developed film against a fine mesh screen positioned within a frame;

said screen having a coating thereon of a light-sensitive emulsion and means on said screen frame defining diagonally positioned alignment means whose placement corresponds to the placement of the first and second locating openings as formed in said film;

positioning the film wth respect to the frame by coaction of said locating openings and said alignment means to fix the position of the first locating opening with respect to the frame and screen and to fix the position of said diagonal axis with respect to the frame screen;

shining a light through the film to expose the emulsion on the screen except at the locations of the coded darkened spaces on the film;

removing unexposed emulsion from the screen to form a coded information screen having information apertures therein which corresponds in size and location to the darkened spaces on the developed film;

placing the coded screen in a silk screen press;

said press including locating means whose placement corresponds with the placement of said alignment means;

positioning the screen on the press by coaction of said locating means with said alignment means;

passing ink through the apertures in the coded information screen onto a credit card sheet to form screen printed first encoded information spaces on a credit card sheet with a first coded information screen;

screen printing second encoded information spaces on the credit card sheet with a second coded information screen; third encoded information spaces with a third coded information screen until all of the desired information spaces have been printed with successive screen printings;

each of said coded information screens having substantially identical alignment means for positioning of each screen with respect to the silk screen press with the alignment of each coded information screen with the press being maintained through coaction of the locating means of the press and the alignment means on the screen;

forming a coded test screen for use in the alignment of the information screens on the press;

said coded test screen having coded test apertures therein corresponding to all of the predetermined spaces on said film for copending of information;

said information screens each having coded information apertures therein corresponding to less than all of the predetermined coded spaces on said film for encoding information;

said credit card sheet having offset printing on its front surface which defines locating symbols and a plurality of credit card areas;

said coded test screen having locating apertures whose location with respect to said coded test apertures is the same as the location of the locating symbols with respect to the credit card areas on the front surface of the credit card sheet;

said coded test apertures in each test screen having a uniform size which differs uniformly from the size of the uniform coded information apertures in the information screens;

positioning said coded test screen on a silk screen press through coaction of the locating means on the press and the alignment means on the test screen and screen printing the back surface of said credit card sheet to form a test sheet having a pattern of test spaces thereon by passing ink through test apertures and forming locating areas thereon by passing ink through the locating apertures;

shining a light through said test sheet to check the alignment of said locating areas with respect to said locating symbols;

adjusting the press if necessary to bring the position of the printed locating areas into alignment with the locating symbols and screen printing a test sheet with the locating areas aligned with the locating symbols;

positioning a first information screen on the press through coaction of the alignment means on the information screen and the locating means on the press and screen printing encoded information spaces on the back surface of a test sheet;

comparing the location of the screen printed encoded information spaces with the location of the screen printed coded test spaces on the test sheet;

adjusting the press if necessary to bring the screen printed coded information spaces into uniform alignment with the screen printed coded test spaces on the test sheet before the screen printing of first information spaces on the back surface of a plurality of credit card sheets;

removing the first information screen from the press and positioning a second information screen on the press through coaction of the alignment means on the second information screen and the locating means on the press;

screen printing coded information spaces on the back surface of a test sheet with the second information screen and adjusting the press if necessary to align the coded information spaces with the coded test apertures on the test sheet before the screen printing of second information spaces on the back surface of the first printed credit card sheets;

repeating the above sequence during third printing, fourth printing, and successive printings as necessary on the back surface of the credit card sheets with a third information screen, a fourth information screen, and successive information screens as necessary for said successive printings by using test sheets to check the position of the third information screen, fourth information screen and said successive information screens before beginning each screen printing, whereby the coded information spaces on the credit card sheets are formed by multiple silk screenings with the test sheets being used to ensure that the coded information spaces printed by each silk screening are in proper alignment with the coded information spaces printed by each of the other silk screenings and that the coded information spaces are also in proper alignment with credit card areas defined on the front surface of the credit card sheets.

13. The process of claim 12 including:
providing said information spaces with a configuration which differs uniformly in size and shape from the configuration of said test spaces.

14. The process of claim 13 including the steps of providing said information spaces with a first color, and
providing said test spaces with a second color which differs from said first color.

15. The process of claim 14 wherein said test spaces have a uniform elongated rectangular configuration and said information spaces have a uniform shortened rectangular configuration, and
the sides of said information spaces are shorter than the longer side dimension of the test spaces but longer than the shorter side dimension of the test spaces.

16. A process for forming credit cards having encoded information printed thereon comprising:
placing a photographic film in contact with a surface having means for exposing film positioned with respect to the surface;
forming on said film means for locating the film which means permits the film to stretch slightly along a diagonal axis of the film and still be maintainable in a flat precisely located condition;
fixing the position of the film with respect to the surface through the use of said means for locating the film;
exposing small predetermined coded spaces on said positioned film by said means for exposing film;
developing the exposed film to provide coded darkened spaces on the film corresponding to the exposed coded spaces;
placing the developed film against a silk screen;
said screen having means to position the film and a coating on the screen of a light-sensitive emulsion;
positioning the film with respect to the screen by coaction of the means on the film for locating the film and the means on the screen for positioning the film;
shining a light through the film to expose the emulsion on the screen except at the locations of the coded darkened areas;
removing unexposed emulsion from the screen to form a coded silk screen having apertures in the screen corresponding to the exposed coded spaces on the film;
placing the coded silk screen on a silk screen press;
said press including means for positioning the silk screen whose placement corresponds with the means on the silk screen for positioning said film;
placing the screen on the press by coaction of the means on the press for positioning the screen with the means on the screen for positioning said film, and
passing ink through the apertures in the silk screen onto a credit card sheet to form screen printed spaces on said sheet which correspond to the coded exposed spaces on the film.

17. The process of claim 16 wherein:
said locating means fixes the position of a corner of the film and also fixes the position of a diagonal axis of the film,
whereby the position of the film is fixed while permitting minor changes in the dimensions of the film along said diagonal axis without distortion of the film surface.

18. The process of claim 16 wherein a plurality of coded silk screens are employed in printing the credit card sheet, including the steps of:
screen printing first coded spaces on the credit card sheet with a first of said plurality of silk screens;
screen printing second coded spaces on the credit card sheet with a second of said plurality of silk screens, third coded spaces with a third of said plurality of silk screens, and successive coded spaces as necessary with successive silk screens;
each of said screens having substantially identical means to position the film for aligning the screen with the means for positioning the screen on the press,
whereby the coded spaces on the credit card sheet are formed by multiple silk screen printings with accurate placement of each of the screens through coaction of the means to position the film on the screens with the means for positioning each screen on the press to provide accurate positioning of each of the separately printed coded spaces on the credit card sheet.

19. A process for forming credit cards having encoded information printed thereon comprising:
forming a coded silk screen having an ink impervious coating thereon with small predetermined coded apertures in said coating;
forming a master with small predetermined coded areas on said master corresponding to said coded apertures;
said master having a rectangular configuration;
forming locating means on the master which position the master with respect to a diagonal axis of the master to permit any subsequent elongation or stretching of the master to occur along said diagonal axis;
forming first means on said screen to position the screen with said first means having a precise predetermined relation with respect to said coded apertures;
said locating means having the same relation to said coded areas as the relation of said first positioning means on the screen to said coded apertures;
aligning said master with said silk screen through coaction of said locating means and said first positioning means with the master positioned in a flat condition against said screen and any elongation or stretching of said master prior to its placement against the screen occurring along said diagonal axis;

said master being used to check the size and placement of said apertures in insuring that the apertures correspond to the size and placement of said coded spaces on said master;

placing said coded silk screen on a silk screen press after forming coded apertures in said silk screen with the silk screen press having second means for positioning the screen and with the placement of the second means corresponding to the placement of said first means;

placing the screen on the silk screen press by coaction of said first means and said second means, and passing ink through the coded apertures in the silk screen onto a credit card sheet to form screen printed coded spaces on said sheet which correspond in size and location to the coded apertures on said silk screen.

20. The process of claim 19 wherein said means to locate the master comprises locating apertures formed in said master.

21. The process of claim 20 wherein one of said locating apertures is circular with said circular aperture lying on said diagonal axis of said master, and with the other of the locating apertures having an elongated configuration and an axis which is positioned on said diagonal axis of the master.

* * * * *